US012660530B2

(12) United States Patent
More et al.

(10) Patent No.: US 12,660,530 B2
(45) Date of Patent: Jun. 16, 2026

(54) METHODS OF FORMING SEMICONDUCTOR DEVICE STRUCTURE

(71) Applicant: TAIWAN SEMICONDUCTOR MANUFACTURING COMPANY, LTD., Hsinchu (TW)

(72) Inventors: Shahaji B. More, Hsinchu (TW); Chien Lin, Hsinchu (TW)

(73) Assignee: TAIWAN SEMICONDUCTOR MANUFACTURING COMPANY, Hsinchu (TW)

( * ) Notice: Subject to any disclaimer, the term of this patent is extended or adjusted under 35 U.S.C. 154(b) by 956 days.

(21) Appl. No.: 17/879,595

(22) Filed: Aug. 2, 2022

(65) Prior Publication Data

US 2023/0343583 A1 Oct. 26, 2023

Related U.S. Application Data

(60) Provisional application No. 63/334,647, filed on Apr. 25, 2022.

(51) Int. Cl.
| | |
|---|---|
| *H10P 14/60* | (2026.01) |
| *H10D 64/01* | (2025.01) |
| *H10D 84/01* | (2026.01) |
| *H10D 84/03* | (2025.01) |

(52) U.S. Cl.
CPC ....... *H10P 14/6682* (2026.01); *H10D 64/017* (2025.01); *H10D 84/013* (2025.01); *H10D 84/0158* (2025.01); *H10D 84/038* (2025.01)

(58) Field of Classification Search
CPC ....... C12C 16/56; C12C 16/029; C30B 33/00; H10D 30/501; H10D 30/502; H10D 30/507; H10D 30/508; H10D 30/509; H10D 30/019; H10D 30/0191; H10D 30/0193; H10D 30/0194; H10D 62/121; H10D 64/017; H10D 84/013; H10D 84/0158; H10D 84/038; H10D 30/797; H10D 30/014; H10D 30/43; H10D 30/6757; H10D 30/6735; H10D 62/822; H10D 84/0128; B82Y 10/00
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |

(Continued)

FOREIGN PATENT DOCUMENTS

| | | |
|---|---|---|
| TW | 201503240 A | 1/2015 |

*Primary Examiner* — Jessica S Manno
*Assistant Examiner* — Ricky Verdes
(74) *Attorney, Agent, or Firm* — NZ Carr Law Office

(57) ABSTRACT

A method for forming a semiconductor device structure is described. The method includes forming a first semiconductor layer over a substrate in a processing chamber and performing a purge process. The purge process includes flowing a chlorine-containing gas into the processing chamber. The method further includes forming a second semiconductor layer over the first semiconductor layer, and an interface region is formed between the first and second semiconductor layers.

20 Claims, 18 Drawing Sheets

(56) References Cited

U.S. PATENT DOCUMENTS

| | | | |
|---|---|---|---|
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2007/0232031 | A1 | 10/2007 | Singh et al. |
| 2013/0153961 | A1 | 6/2013 | Cody et al. |
| 2015/0162403 | A1 | 6/2015 | Oxland |
| 2019/0221483 | A1* | 7/2019 | Mulfinger ............ H10D 62/116 |
| 2020/0312658 | A1* | 10/2020 | Miura ............... H01L 21/67069 |
| 2021/0249517 | A1 | 8/2021 | Cheng et al. |
| 2021/0327704 | A1 | 10/2021 | Kajbafvala et al. |

* cited by examiner

100

104a
102a

101

Z
X

100

106a
102b
104a
102a

101

Z
X

100

104b
102c
106a
102b
104a
102a

101

Z
X

100

106b
102d 104b
102c
106a
102b
104a
102a

101

Z
X

100

T1

T2

T3

106c
102f
104c
102e
106b
102d
104b
102c
106a
102b
104a
102a

101

Z

X

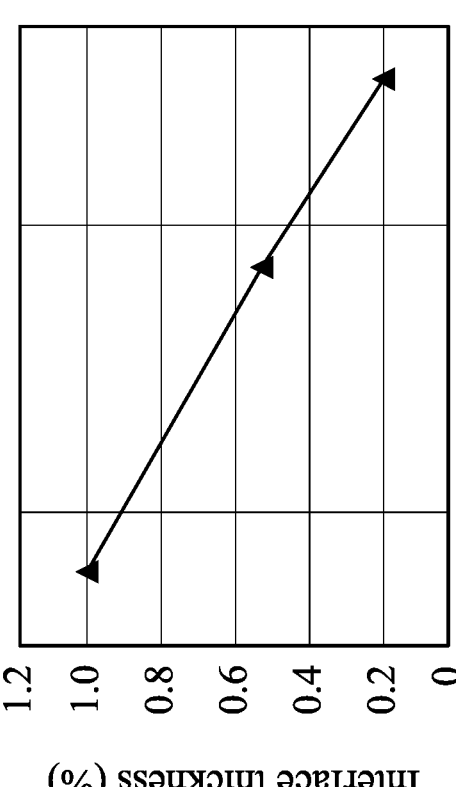
Fig. 4
Interface thickness (%)
Fig. 2
200b 200 200a
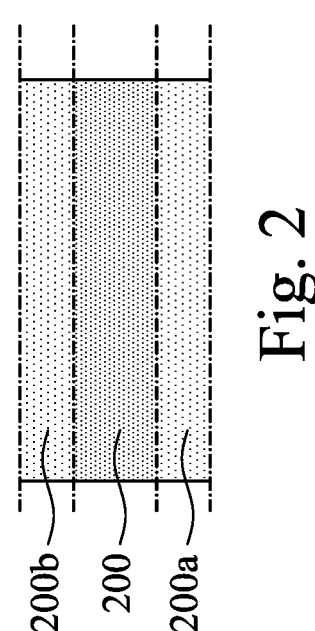
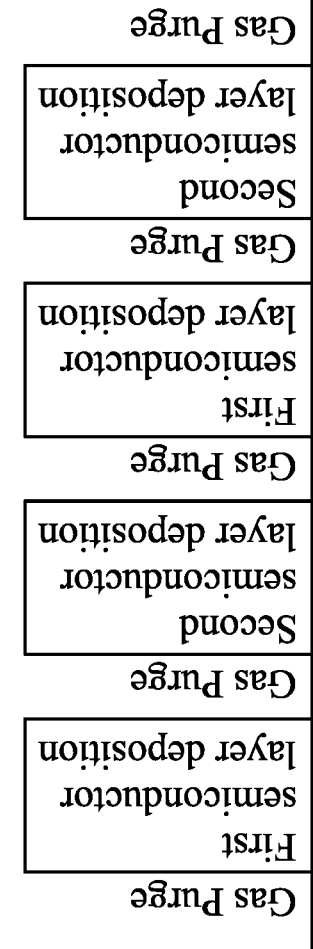
Fig. 3
Gas Purge
Second semiconductor layer deposition
Gas Purge
First semiconductor layer deposition
Gas Purge
Second semiconductor layer deposition
Gas Purge
First semiconductor layer deposition
Gas Purge
Tr

METHODS OF FORMING SEMICONDUCTOR DEVICE STRUCTURE

CROSS-REFERENCE TO RELATED APPLICATIONS

This application claims priority to U.S. Provisional Application No. 63/334,647 filed on Apr. 25, 2022, the contents of which are hereby incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a cross-sectional side view of a semiconductor layer of the semiconductor device structure, in accordance with some embodiments.

FIG. 3 is a chart showing the processes for forming a stack of semiconductor layers, in accordance with some embodiments.

FIG. 4 is a chart showing a decrease in thickness of an interface region of the stack of semiconductor layers, in accordance with some embodiments.

DETAILED DESCRIPTION

Figure 1A:
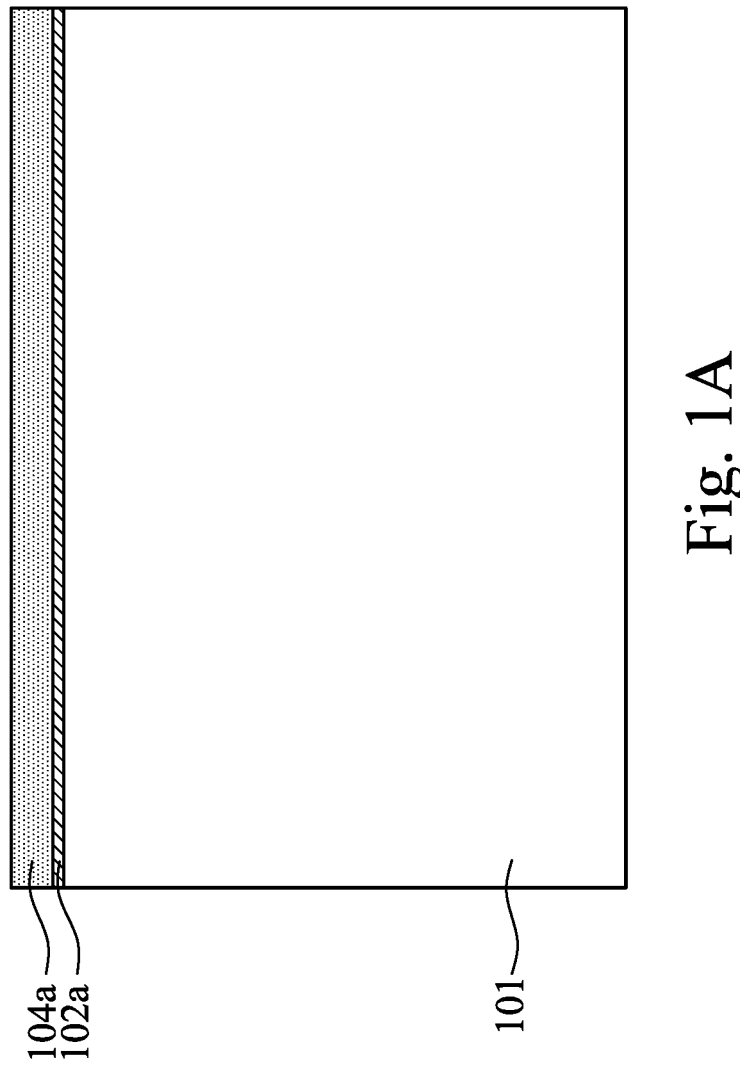
FIGS. 1A-1F are cross-sectional side views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-8 show exemplary sequential processes for manufacturing a semiconductor device structure 100, in accordance with some embodiments. It is understood that additional operations can be provided before, during, and after processes shown by FIGS. 1-8, and some of the operations described below can be replaced or eliminated, for additional embodiments of the method. The order of the operations/processes may be interchangeable.

FIGS. 1A-1F are cross-sectional side views of various stages of manufacturing the semiconductor device structure 100, in accordance with some embodiments. As shown in FIG. 1A, a first semiconductor layer 104$a$ is deposited over a substrate 101. The substrate 101 may be a semiconductor substrate. In some embodiments, the substrate 101 includes a crystalline semiconductor layer on at least the surface of the substrate 101. The substrate 101 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 101 is made of Si. In some embodiments, the substrate 101 is a silicon-on-insulator (SOI) substrate, which includes an insulating layer (not shown) disposed between two silicon layers. In one aspect, the insulating layer is an oxide.

The substrate 101 may include various regions that have been suitably doped with impurities (e.g., p-type or n-type impurities). The dopants are, for example boron for a p-type field effect transistor (FET) and phosphorus for an n-type FET.

The first semiconductor layer 104$a$ includes a semiconductor material different from the semiconductor material of the substrate 101. In some embodiments, the substrate 101 includes silicon, and the first semiconductor layer 104$a$ includes silicon germanium. The first semiconductor layer 104$a$ may be intrinsic or doped with a p-type dopant or an n-type dopant. The first semiconductor layer 104$a$ is formed by placing the substrate 101 into a processing chamber and flowing precursors into the processing chamber. The processing chamber may be any suitable processing chamber, such as an epi chamber. In some embodiments, the first semiconductor layer 104a includes silicon germanium, and the precursors include one or more silicon-containing precursors and one or more germanium containing precursors. For example, the one or more silicon-containing precursors include dichlorosilane (DCS) and silane. The DCS precursor improves the crystallization of SiGe, and the silane precursor helps with the growth rate. Other silicon-containing precursors may be used instead of DCS and silane. A carrier gas may be also flowed into the processing chamber along with the one or more silicon-containing precursors and the one or more germanium-containing precursors. The pressure in the processing chamber may range from about 5 Torr to about 15 Torr. The processing temperature may range from about 600 degrees Celsius to about 800 degrees Celsius.

An interface region 102a is formed between the substrate 101 and the first semiconductor layer 104a during the formation of the first semiconductor layer 104a. The interface region 102a may be defined based on the atomic percentage of germanium. For example, the concentration (i.e., atomic percentage) of germanium in the layer formed on the substrate 101 may be increasing from 0 atomic percent to a predetermined atomic percent, such as 30 atomic percent, in the growth direction of the layer. The layer formed on the substrate 101 may have a first thickness having an increasing atomic percentage of germanium and a second thickness having a substantially constant atomic percentage of germanium. The interface region 102a may be a portion of the first thickness. In some embodiments, the interface region 102a is the middle 60 percent to 80 percent of the first thickness. For example, the first thickness has a bottom portion of about 10 percent to 20 percent, a middle portion of about 60 percent to 80 percent, and a top portion of about 10 percent to 20 percent. The bottom portion may be defined as part of the substrate 101, the middle portion may be defined as the interface region 102a, and the top portion may be defined as part of the first semiconductor layer 104a. In some embodiments, the thickness of the interface region 102a ranges from about 0.2 nm to about 0.6 nm. The process to form the first semiconductor layer 104a makes it difficult to have the thickness of the interface region 102a less than about 0.2 nm. On the other hand, if the thickness of the interface region 102a is greater than about 0.6 nm, there may be loss of the substrate 101 during the subsequent channel release process.

After the first semiconductor layer 104a reaches a predetermined thickness, the one or more germanium-containing precursors are stopped from flowing into the processing chamber, and a chlorine-containing gas is flowed into the processing chamber. This may be referred to as a first purge process. Because the next process is to form a silicon layer, the purge process is performed to purge any remaining one or more germanium-containing precursors from the processing chamber. Furthermore, any germanium ions formed on the surface of the first semiconductor layer 104a are removed by the chlorine-containing gas. In some embodiments, the purge process includes flowing a first silicon-containing precursor, a second silicon-containing precursor, and the chlorine-containing gas into the processing chamber along with a carrier gas, such as hydrogen gas or nitrogen gas. The first and second silicon-containing precursors may be the one or more silicon-containing precursors. The first silicon-containing precursor may be DCS having a first flow rate, and the second silicon-containing precursor may be silane having a second flow rate. In some embodiments, the first flow rate is about 10 percent to about 90 percent of the second flow rate. The chlorine-containing gas is flowed into the processing chamber during the purge process at a third flow rate. In some embodiments, the third flow rate is about 30 percent to about 70 percent of the second flow rate. The chlorine-containing gas is utilized to remove germanium ions formed on the surface of the first semiconductor layer 104a and to reduce germanium segregation. If the third flow rate is less than about 30 percent of the second flow rate, germanium ions formed on the surface of the first semiconductor layer 104a may not be substantially removed. On the other hand, if the third flow rate is greater than about 70 percent of the second flow rate, the first semiconductor layer 104a may be unintentionally etched by the chlorine-containing gas. The chlorine-containing gas may be any suitable chlorine-containing gas, such as HCl or $Cl_2$. In some embodiments, the chlorine-containing gas is silicon free.

Figure 1B:
Figure 1B:
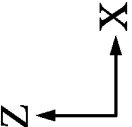

The pressure inside the processing chamber during the first purge process may be substantially greater than the pressure during the formation of the first semiconductor layer 104a. Higher pressure during the first purge process can further reduce the thickness of an interface region 102b (FIG. 1B). In some embodiments, the pressure during the first purge process ranges from about 5 Torr to about 50 Torr, such as from about 10 Torr to about 30 Torr. The processing temperature during the first purge process may be unchanged. The duration of the first purge process may range from about 3 seconds to about 15 seconds. If the duration is less than about 3 seconds, germanium ions formed on the surface of the first semiconductor layer 104a may not be substantially removed. On the other hand, if the duration is greater than about 15 seconds, manufacturing cost is increased without significant advantage.

Next, as shown in FIG. 1B, a second semiconductor layer 106a is deposited over the first semiconductor layer 104a. The first semiconductor layer 104a and the second semiconductor layer 106a are made of semiconductor materials having different etch selectivity and/or oxidation rates. For example, the first semiconductor layer 104a is made of SiGe and the second semiconductor layer 106a is made of Si. The second semiconductor layer 106a may be intrinsic or doped with a p-type dopant or an n-type dopant. In some embodiments, the second semiconductor layer 106a includes the same material as the substrate 101. The second semiconductor layer 106a is deposited by flowing one or more silicon-containing precursors along with a carrier gas into the processing chamber. In some embodiments, the one or more silicon-containing precursors include silane. For example, DCS, silane, and chlorine-containing gas are flowed into the processing chamber during the first purge process, and DCS and chlorine-containing gas are stopped from flowing into the processing chamber while silane continues to flow into the processing chamber when depositing the second semiconductor layer 106a. The pressure in the processing chamber during the deposition of the second semiconductor layer 106a ranges from about 5 Torr to about 15 Torr, which is substantially less than the pressure during the first purge process.

An interface region 102b is formed between the first semiconductor layer 104a and the second semiconductor layer 106a during the formation of the second semiconductor layer 106a. The interface region 102b may be defined based on the atomic percentage of germanium. For example, the concentration (i.e., atomic percentage) of germanium in the layer formed on the first semiconductor layer 104a may be decreased from a first percentage to 0 atomic percent in the growth direction of the layer. The layer formed on the first semiconductor layer 104a may have a first thickness having a decreasing atomic percentage of germanium and a second thickness having substantially 0 atomic percentage of germanium. The interface region 102b may be a portion of the first thickness. In some embodiments, the interface region 102b is the middle 60 percent to 80 percent of the first thickness. For example, the first thickness has a bottom portion of about 10 percent to 20 percent, a middle portion of about 60 percent to 80 percent, and a top portion of about 10 percent to 20 percent. The bottom portion may be defined as part of the first semiconductor layer 104a, the middle portion may be defined as the interface region 102b, and the top portion may be defined as part of the second semiconductor layer 106a.

Because the germanium ions formed on the surface of the first semiconductor layer 104a are removed by the chlorine-containing gas during the first purge process, the thickness of the interface region 102b is substantially small. Furthermore, high processing pressure during the first purge process also leads to reduced thickness of the interface region 102b. In some embodiments, the thickness of the interface region 102b ranges from about 0.6 nm to about 1 nm. If without the chlorine-containing gas during the first purge process, the germanium ions formed on the surface of the first semiconductor layer 104a would migrate to the second semiconductor layer 106a, leading to a thicker interface region 102b. By performing the first purge process as described above, the thickness of the interface region 102b is controlled to be from about 0.6 nm to about 1 nm. It is difficult to have the thickness of the interface region 102b less than about 0.6 nm. On the other hand, if the thickness of the interface region 102a is greater than about 1 nm, there may be loss of the second semiconductor layer 106a during the subsequent channel release process. In some embodiments, the thickness of the interface region 102a is substantially smaller than the thickness of the interface region 102b, because the diffusion rate of germanium into the substrate 101 is substantially slower than the diffusion rate of germanium into the second semiconductor layer 106a. In some embodiments, the difference between the thickness of the interface region 102a and the thickness of the interface region 102b ranges from about 0.1 nm to about 0.5 nm.

After the second semiconductor layer 106a reaches a predetermined thickness, a second purge process is performed. The second purge process may be substantially the same as the first purge process, with the exception of shorter duration. For example, the first and second silicon-containing precursors and the chlorine-containing gas are flowed into the processing chamber along with a carrier gas during the second purge process. In some embodiments, the second silicon-containing precursor, which may be silane, was flowed into the processing chamber during the deposition of the second semiconductor layer 106a and continues to flow into the processing chamber during the second purge process. The first silicon-containing precursor, which may be DCS, and the chlorine-containing gas start to flow into the processing chamber at the beginning of the second purge process. Even though there are no germanium ions formed on the surface of the second semiconductor layer 106a, the chlorine-containing gas is still introduced into the processing chamber during the second purge process to make the surface of the second semiconductor layer 106a smoother for the subsequent deposition. In some embodiments, the time duration of the second purge process is substantially less than the first purge process.

Figure 1C:
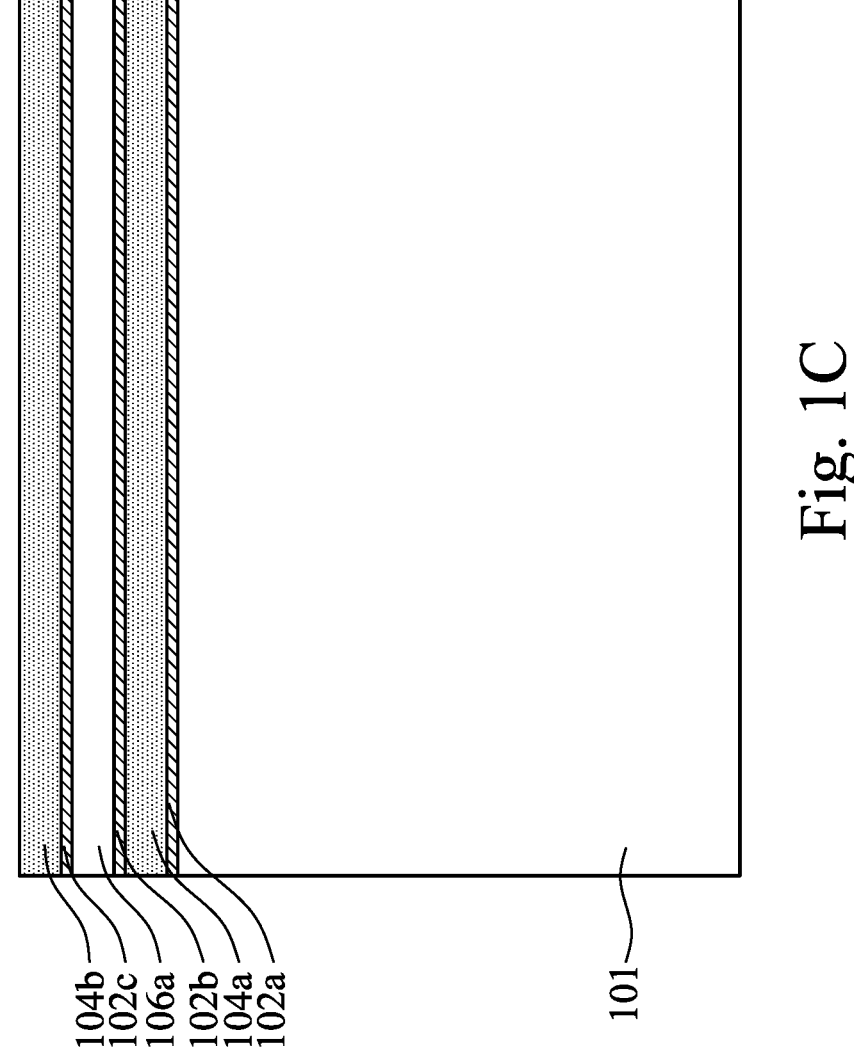

Next, as shown in FIG. 1C, another first semiconductor layer 104b is deposited over the second semiconductor layer

106a, and an interface region 102c is formed between the first semiconductor layer 104b and the second semiconductor layer 106a. The interface region 102c may be similarly defined as the interface region 102a, such as having an increasing concentration of germanium in the growth direction of the first semiconductor layer 104b. The first semiconductor layer 104b may include the same material as the first semiconductor layer 104a and may be formed by the same process as the first semiconductor layer 104a. For example, the one or more silicon-containing precursors and the one or more germanium-containing precursors are flowed into the processing chamber along with a carrier gas. In some embodiments, the one or more silicon-containing precursors include the first and second silicon-containing precursors, which were flowed into the processing chamber during the second purge process and continue to flow into the processing chamber during the deposition of the first semiconductor layer 104b. The chlorine-containing gas is stopped from flowing into the processing chamber at the beginning of the deposition of the first semiconductor layer 104b. The thickness of the interface region 102c may be substantially greater than the thickness of the interface region 102a because the diffusion rate of germanium into the substrate 101 is substantially slower than the diffusion rate of germanium into the second semiconductor layer 106a.

Figure 1D:
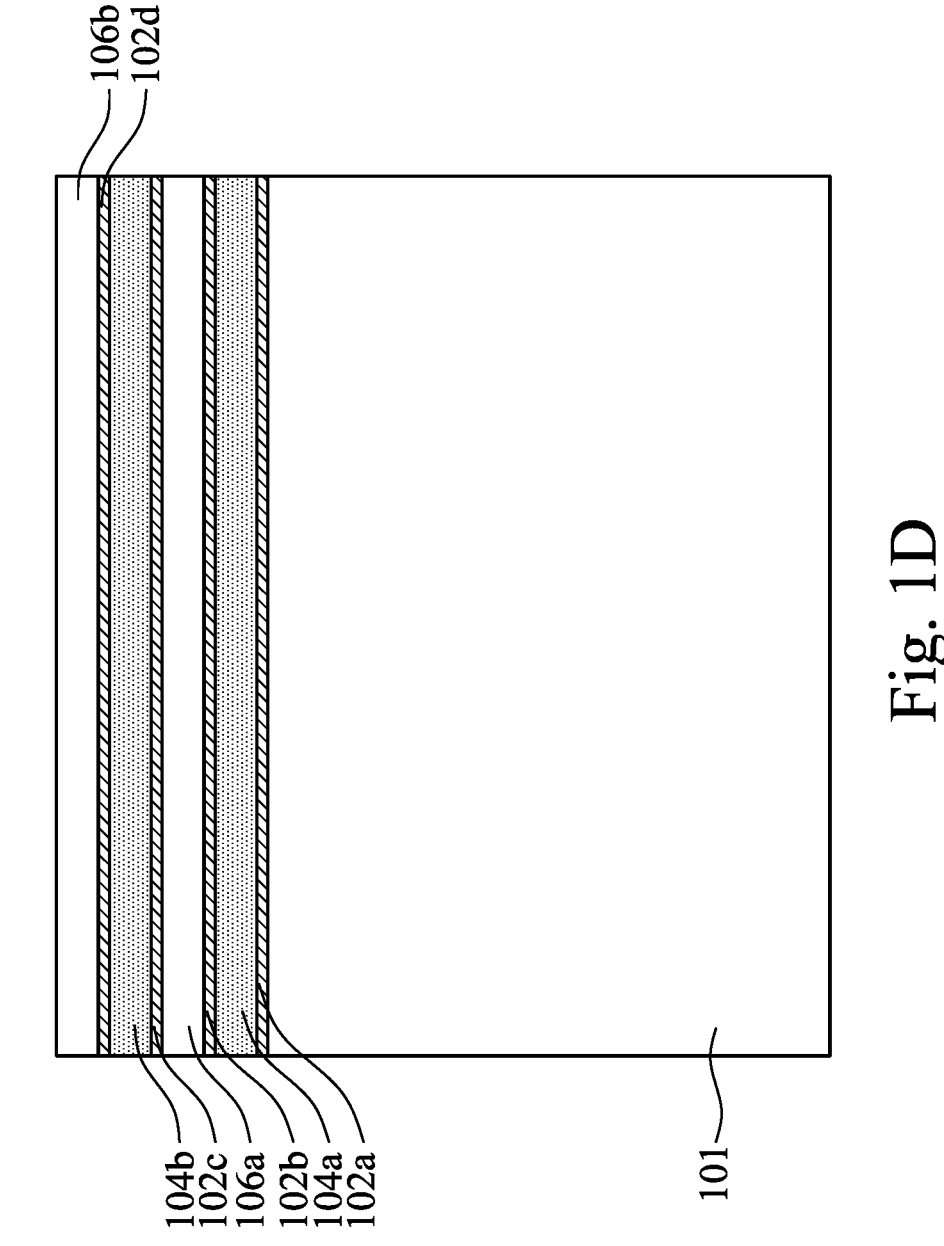

Next, a third purge process is performed after the first semiconductor layer 104b reaches a predetermined thickness. The third purge process may be the same as the first purge process. The chlorine-containing gas in the third purge process removes germanium ions formed on the surface of the first semiconductor layer 104b and to reduce germanium segregation, which leads to a thinner subsequently formed interface region 102d (FIG. 1D). Furthermore, the higher pressure during the third purge process can further reduce the thickness of the subsequently formed interface region 102d (FIG. 1D).

As shown in FIG. 1D, another second semiconductor layer 106b is deposited over the first semiconductor layer 104b, and the interface region 102d is formed between the first semiconductor layer 104b and the second semiconductor layer 106b. The interface region 102d may be similarly defined as the interface region 102b, such as having a decreasing concentration of germanium in the growth direction of the second semiconductor layer 106b. The second semiconductor layer 106b may include the same material as the second semiconductor layer 106a and may be formed by the same process as the second semiconductor layer 106a. The transition from the third purge process to the deposition of the second semiconductor layer 106b may be the same as the transition from the first purge process to the deposition of the second semiconductor layer 106a. In some embodiments, the thickness of the interface region 102d is substantially greater than the thickness of the interface region 102b due to temperature increase and heat accumulation during the deposition processes. Increased temperature can lead to increased germanium segregation at the interface. However, the thickness of the interface region 102d is still reduced as a result of the third purge process.

Next, a fourth purge process is performed after the second semiconductor layer 106b reaches a predetermined thickness. The fourth purge process may be the same as the second purge process. The chlorine-containing gas in the fourth purge process helps to make surface of the second semiconductor layer 106b smoother for the subsequent formed first semiconductor layer 104c (FIG. 1E).

Figure 1E:
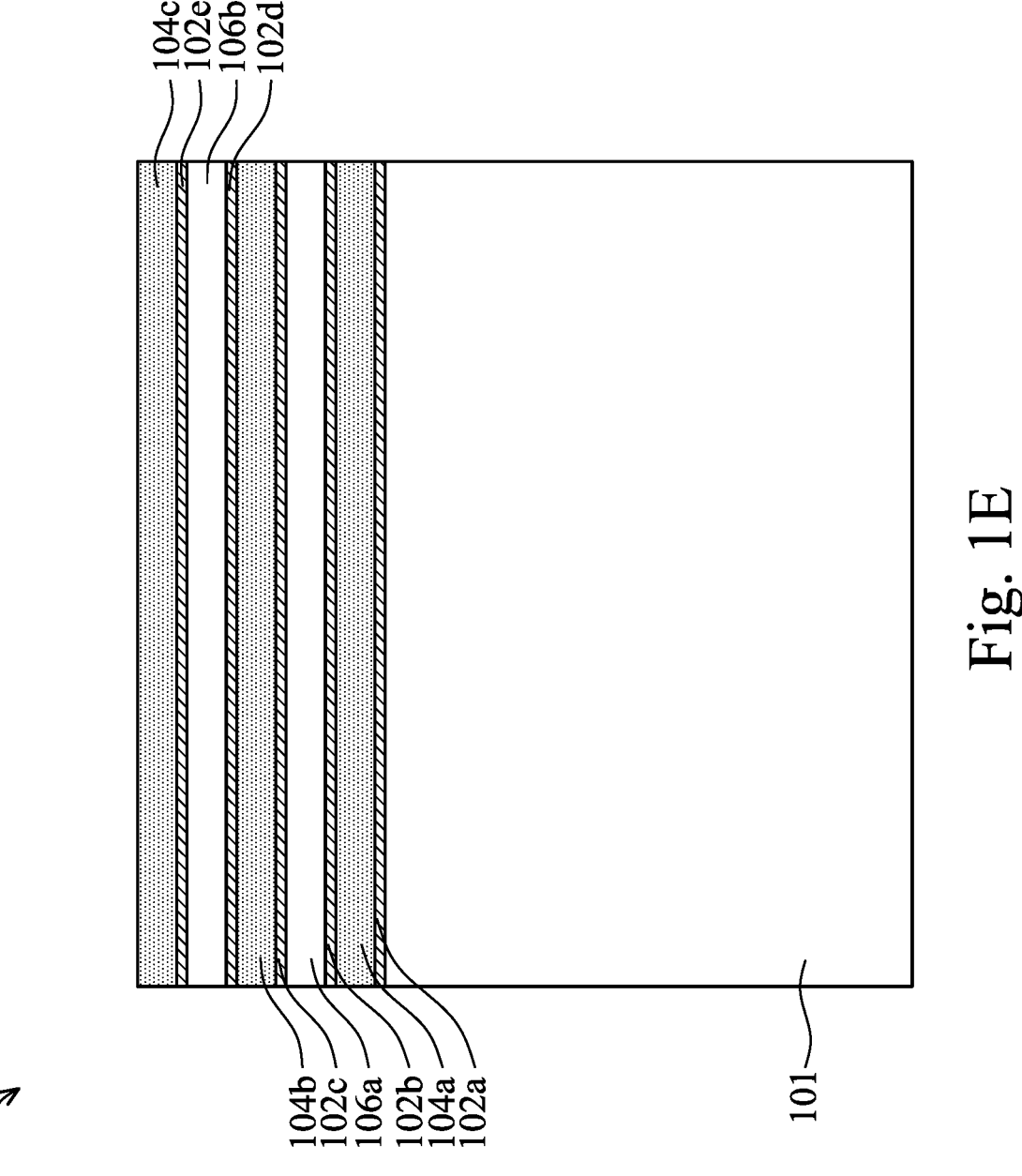

As shown in FIG. 1E, another first semiconductor layer 104c is deposited over the second semiconductor layer 106b, and an interface region 102e is formed between the first semiconductor layer 104c and the second semiconductor layer 106b. The interface region 102e may be similarly defined as the interface region 102c, such as having an increasing concentration of germanium in the growth direction of the first semiconductor layer 104c. The first semiconductor layer 104c may include the same material as the first semiconductor layer 104a and may be formed by the same process as the first semiconductor layer 104a. For example, the one or more silicon-containing precursors and the one or more germanium-containing precursors are flowed into the processing chamber along with a carrier gas. In some embodiments, the one or more silicon-containing precursors include the first and second silicon-containing precursors, which were flowed into the processing chamber during the fourth purge process and continue to flow into the processing chamber during the deposition of the first semiconductor layer 104c. The chlorine-containing gas is stopped from flowing into the processing chamber at the beginning of the deposition of the first semiconductor layer 104c.

In some embodiments, the thickness of the interface region 102e ranges from about 0.6 nm to about 0.8 nm. The thickness of the interface region 102e may be substantially greater than the thickness of the interface region 102c, which is substantially greater than the thickness of the interface region 102a. The difference between the thickness of the interface region 102e and the thickness of the interface region 102a may range from about 0.1 nm to about 0.5 nm. The difference may not be less than about 0.1 nm due to the increased germanium segregation as a result of increased temperature. On the other hand, if the difference is greater than about 0.5 nm, loss of the second semiconductor layer 106b during the subsequent channel release process may occur.

Figure 1F:
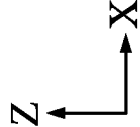

Next, a fifth purge process is performed after the first semiconductor layer 104c reaches a predetermined thickness. The fifth purge process may be the same as the third purge process. The chlorine-containing gas in the fifth purge process removes germanium ions formed on the surface of the first semiconductor layer 104c and to reduce germanium segregation, which leads to a thinner subsequently formed interface region 102f (FIG. 1F). Furthermore, the higher pressure during the fifth purge process can further reduce the thickness of the subsequently formed interface region 102f (FIG. 1F).

As shown in FIG. 1F, another second semiconductor layer 106c is deposited over the first semiconductor layer 104c, and the interface region 102f is formed between the first semiconductor layer 104c and the second semiconductor layer 106c. The interface region 102f may be similarly defined as the interface region 102d, such as having a decreasing concentration of germanium in the growth direction of the second semiconductor layer 106c. The second semiconductor layer 106c may include the same material as the second semiconductor layer 106a and may be formed by the same process as the second semiconductor layer 106a. The transition from the fifth purge process to the deposition of the second semiconductor layer 106c may be the same as the transition from the third purge process to the deposition of the second semiconductor layer 106b. In some embodiments, the thickness of the interface region 102f is substantially greater than the thickness of the interface region 102d due to temperature increase and heat accumulation during the deposition processes. Increased temperature can lead to increased germanium segregation at the interface. However, the thickness of the interface region 102f is still reduced as a result of the fifth purge process. In some embodiments, the thickness of the interface region 102f is substantially greater than the thickness of the interface region 102e. The difference between the thickness of the interface region 102f and the thickness of the interface region 102e may range from about 0.2 nm to about 0.6 nm.

In some embodiments, the thickness of the interface region 102f ranges from about 0.8 nm to about 1.2 nm. The thickness of the interface region 102f may be substantially greater than the thickness of the interface region 102d, which is substantially greater than the thickness of the interface region 102b. The difference between the thickness of the interface region 102f and the thickness of the interface region 102b may range from about 0.1 nm to about 0.5 nm. The difference may not be less than about 0.1 nm due to the increased germanium segregation as a result of increased temperature. On the other hand, if the difference is greater than about 0.5 nm, loss of the second semiconductor layer 106c during the subsequent channel release process may occur.

The second semiconductor layers 106a-c or portions thereof may form nanostructure channel(s), such as nanosheet channel(s), of the semiconductor device structure 100. The semiconductor device structure 100 may include a nanostructure transistor. The term nanostructure is used herein to designate any material portion with nanoscale, or even microscale dimensions, and having any suitable shape, such as an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The nanostructure channel(s) of the semiconductor device structure 100 may be surrounded by the gate electrode layer. The nanostructure transistors may be referred to as nanosheet transistors, nanowire transistors, gate-all-around (GAA) transistors, multi-bridge channel (MBC) transistors, or any transistors having the gate electrode layer surrounding the channels. The use of the second semiconductor layers 106a-c to define a channel or channels of the semiconductor device structure 100 is further discussed below.

The first semiconductor layers 104a-c and the interface regions 102a-f may eventually be removed and serve to define a vertical distance between adjacent channels for the semiconductor device structure 100. As described above, the thicknesses of the interface regions 102a-f are reduced as a result of the purge processes, leading to increased thickness of the second semiconductor layers 106a-c and improved device performance.

It is noted that 3 second semiconductor layers 106a-c and 3 first semiconductor layers 104a-c are alternately arranged as illustrated in FIG. 1F, which is for illustrative purposes and not intended to be limiting beyond what is specifically recited in the claims. It can be appreciated that any number of first and second semiconductor layers 104a-c, 106a-c can be formed; the number of layers depending on the predetermined number of channels for the semiconductor device structure 100. In some embodiments, the number of second semiconductor layers 106a-c, which is the number of channels, is between 3 and 8.

As shown in FIG. 1F, the total thickness T1 from the interface region 102a to the second semiconductor layer 106c ranges from about 30 nm to about 60 nm. The total thickness T1 may be the fin height. If the total thickness T1 is less than about 30 nm, there is less carrier collection and less device performance. On the other hand, if the total thickness T1 is greater than about 60 nm, fin bending issue may be induced and device performance may be reduced. The second semiconductor layer 106b has a thickness T2 ranging from about 5 nm to about 8 nm. In some embodiments, the second semiconductor layers 106a, 106c also have the thickness T2. In other words, the nanostructure channel may have the thickness T2 ranging from about 5 nm to about 8 nm. If the thickness of the nanostructure channel is less than about 5 nm, there is less carrier collection and less device performance. If the thickness T2 of the nanostructure channel is greater than about 8 nm, relative space for the gate electrode layer 172 (FIG. 8) would be less with respect to the total thickness T1.

Figure 8:
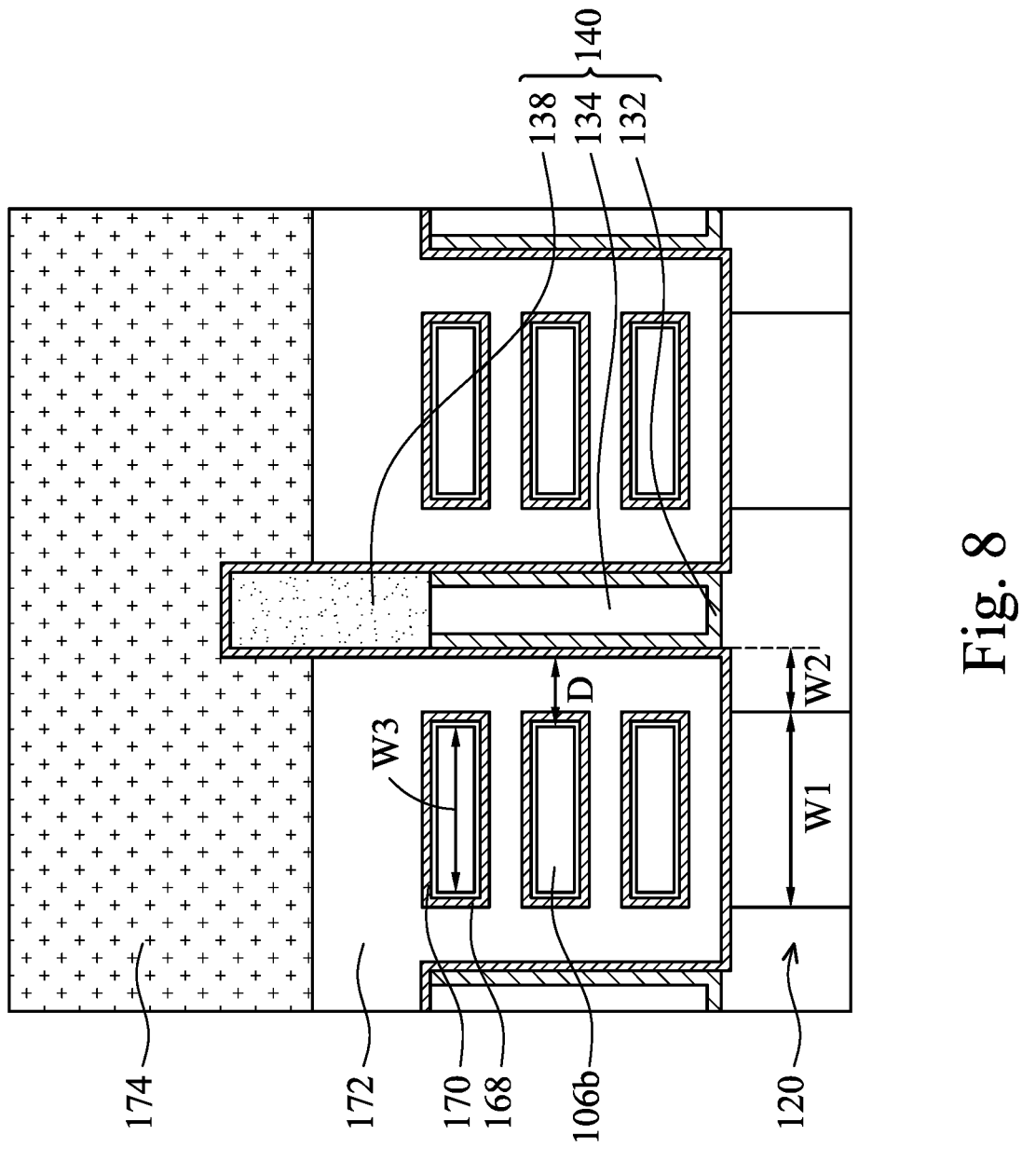
FIG. 8 is a cross-sectional side view of one of various stages of manufacturing the semiconductor device structure taken along line C-C of FIG. 7F, in accordance with some embodiments.

In some embodiments, the thickness T3 of the first semiconductor layer 104b with the interface region 102d disposed thereon and the interface region 102c disposed thereunder ranges from about 5 nm to about 10 nm. If the thickness T3 is less than about 5 nm, there is less space for the deposition of the gate electrode layer 172 (FIG. 8). If the thickness T3 is greater than about 10 nm, relative space for the gate electrode layer 172 (FIG. 8) would be increased with respect to the total thickness T1, leading to less carrier collection due to thinner nanostructure channel.

FIG. 2 is a cross-sectional side view of a semiconductor layer 200 of the semiconductor device structure, in accordance with some embodiments. As shown in FIG. 2, the semiconductor layer 200 is disposed between two interface regions 200a, 200b. The semiconductor layer 200 may be any of the first semiconductor layers 104a-c, and the interface regions 200a, 200b may be any two interface regions 102a-f that are in contact with one of the first semiconductor layers 104a-c. In some embodiments, the semiconductor layer 200 has a germanium concentration ranging from about 15 atomic percent to about 50 atomic percent. The interface region 200a may have a gradient germanium concentration ranging from about 0 atomic percent to about 20 atomic percent in the growth direction of the semiconductor layer 200. The interface region 200b may have a gradient germanium concentration ranging from about 20 atomic percent to about 0 atomic percent in the growth direction of the semiconductor layer 200.

FIG. 3 is a chart showing the processes for forming a stack of semiconductor layers, in accordance with some embodiments. As shown in FIG. 3, the first semiconductor layers 104a-c and the second semiconductor layers 106a-c are alternately deposited, and a gas purge is performed between the deposition processes. The first semiconductor layer 104a, 104b, or 104c is deposited between two gas purges. For example, the second purge process as described is FIG. 1B is performed, followed by depositing the first semiconductor layer 104a, 104b, or 104c, followed by performing the first purge process as described in FIG. 1A. The second semiconductor layer 106a, 106b, or 106c is deposited between two gas purges. For example, the first purge process as described in FIG. 1A is performed, followed by depositing the second semiconductor layer 106a, 106b, or 106c, followed by performing the second purge process as described in FIG. 1B. The purge processes help to reduce the thicknesses of the interface regions 102a-f.

FIG. 4 is a chart showing a decrease in thickness of an interface region (such as any of the interface regions 102a-f) of the stack of semiconductor layers, in accordance with some embodiments. As shown in FIG. 4, a purge process utilizing $H_2$ or $N_2$ without the chlorine-containing gas and the silicon precursors is used as a reference point (data point shown on the chart at 1.0). By including the chlorine-containing gas and the chlorine-containing silicon precursor, such as DCS, in the purge process, the thickness of the interface region is reduced by almost 50 percent (data point shown on the chart at a little higher than 0.5). By including the chlorine-containing gas, the chlorine-containing silicon precursor, and a transition gas, such as silane, and at a high pressure, such as the pressure during the first purge process, the thickness of the interface region is further reduced (data point shown on the chart at about 0.2).

Figure 5:
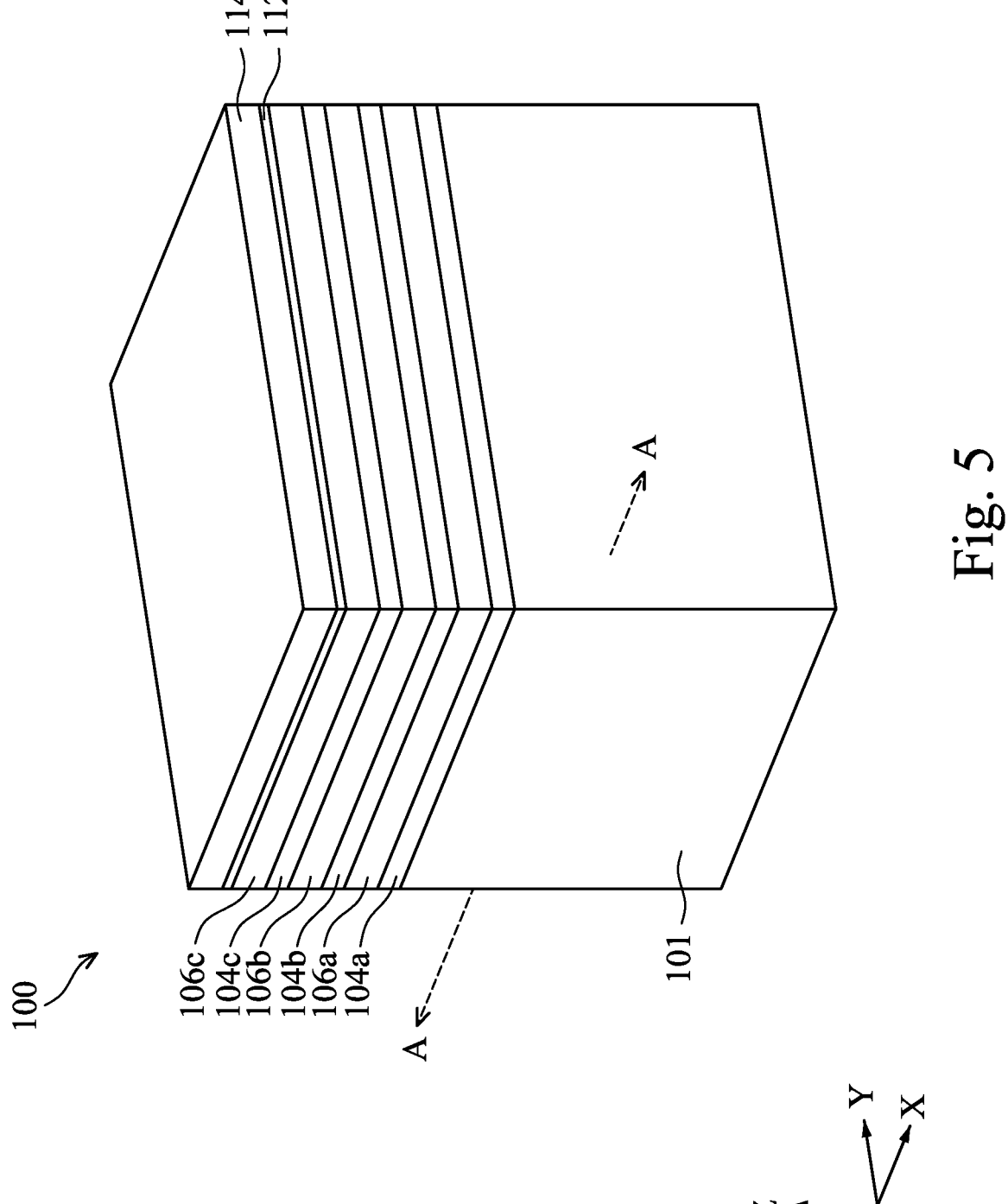
FIG. 5 is a perspective view of one of various stages of manufacturing the semiconductor device structure, in accordance with some embodiments.

FIG. 5 is a perspective view of one of various stages of manufacturing the semiconductor device structure 100, in accordance with some embodiments. The interface regions 102a-f are omitted in FIG. 2 for clarity. As shown in FIG. 5, an oxide layer 112 is formed on the second semiconductor layer 106c, and a nitride layer 114 is formed on the oxide layer 112. The oxide layer 112 may be silicon oxide and may have different etch selectivity compared to the nitride layer 114. The nitride layer 114 may include any suitable nitride material, such as silicon nitride. In some embodiments, the oxide layer 112 and the nitride layer 114 may be a mask structure.

Figure 6A:
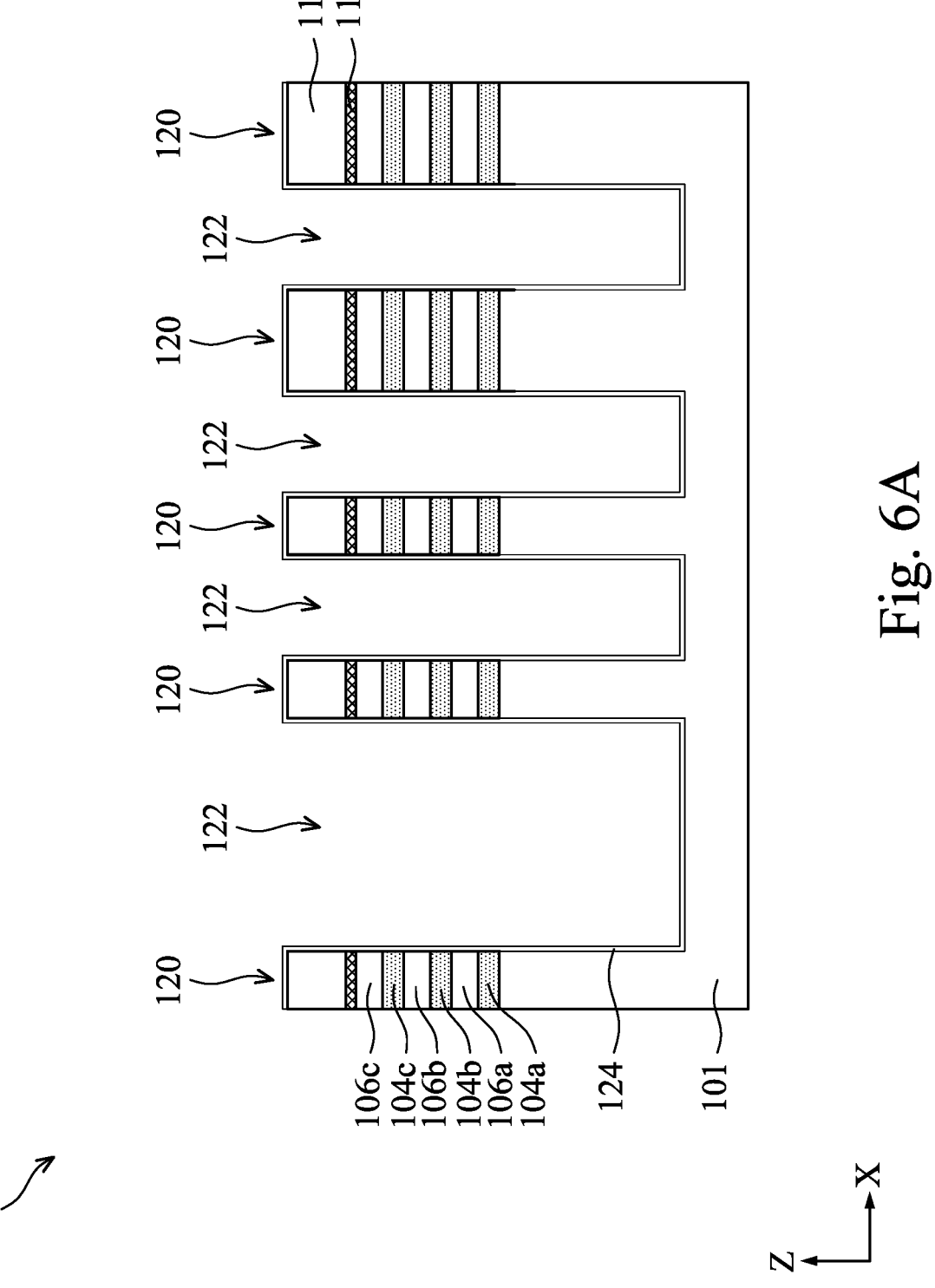
FIGS. 6A-6F are cross-sectional side views of various stages of manufacturing the semiconductor device structure taken along line A-A of FIG. 5, in accordance with some embodiments.

FIGS. 6A-6F are cross-sectional side views of various stages of manufacturing the semiconductor device structure 100 taken along line A-A of FIG. 5, in accordance with some embodiments. As shown in FIG. 6A, fins 120 are formed. The fins 120 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 120 by etching the oxide layer 112, the nitride layer 114, the first and second semiconductor layers 104a-c, 106a-c, and the substrate 101. The etching process can include dry etching, wet etching, reactive ion etching (RIE), and/or other suitable processes. Trenches 122 are formed between adjacent fins 102.

A liner 124 is formed over the substrate 101 and the fins 120, as shown in FIG. 6A. The liner 124 may be made of a semiconductor material, such as Si. In some embodiments, the liner 124 is made of the same material as the substrate 101. The liner 124 may be a conformal layer and may be formed by a conformal process, such as an atomic layer deposition (ALD) process. The term "conformal" may be used herein for ease of description upon a layer having substantial same thickness over various regions.

Figure 6B:
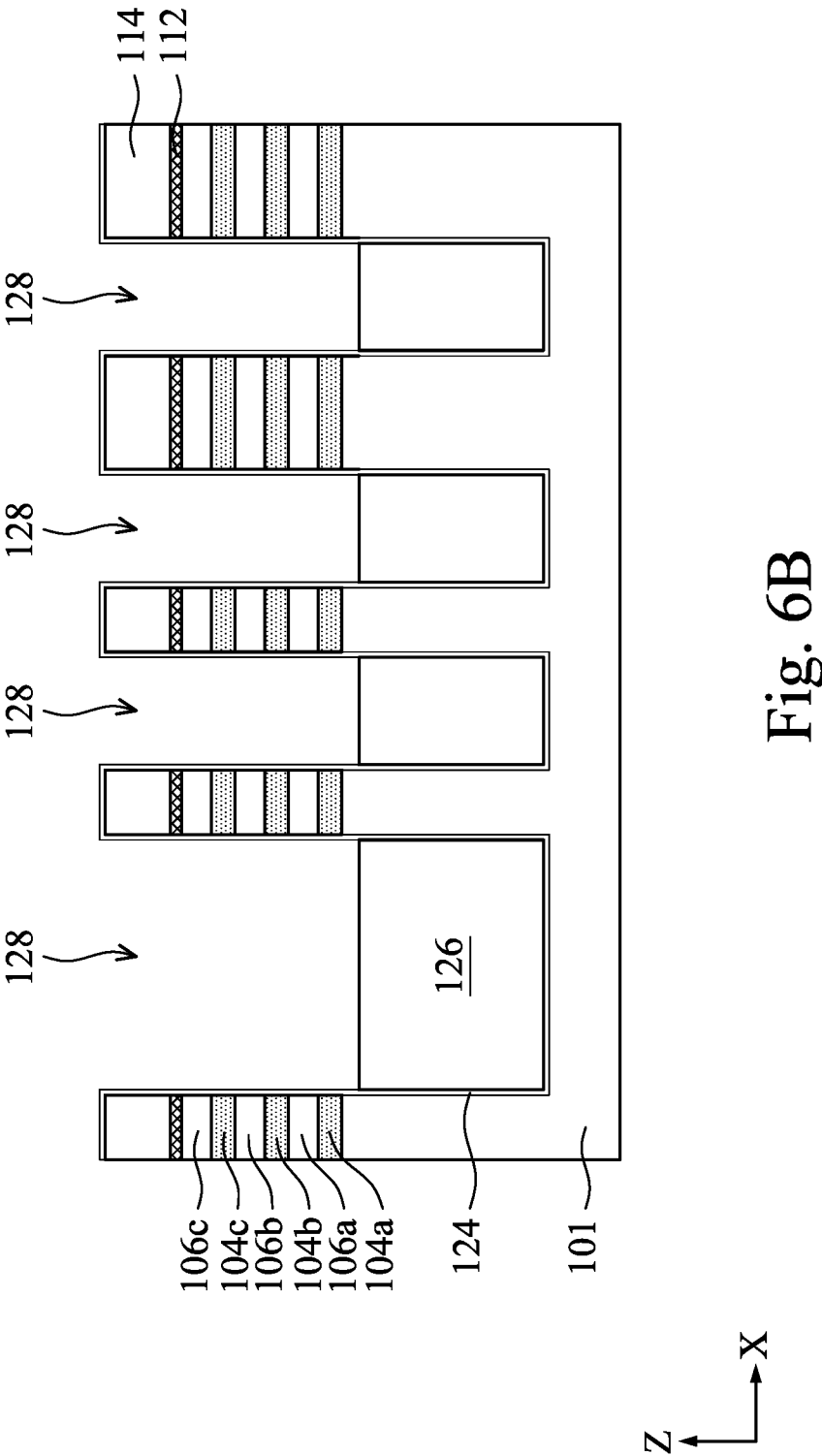

As shown in FIG. 6B, an insulating material 126 is formed on the substrate 101. The insulating material 126 may fill the trenches 122 (FIG. 6A) and then recessed to a location below the level of the bottom surface of the first semiconductor layer 104a. The insulating material 126 may be made of an oxygen-containing material, such as silicon oxide or fluorine-doped silicate glass (FSG); a nitrogen-containing material, such as silicon nitride, silicon oxynitride (SiON), SiOCN, SiCN; a low-K dielectric material (e.g., a material having a K value lower than that of silicon oxide); or any suitable dielectric material. The insulating material 126 may be formed by any suitable method, such as low-pressure chemical vapor deposition (LPCVD), plasma enhanced CVD (PECVD) or flowable CVD (FCVD). Trenches 128 may be formed as a result of the recessing the insulating material 126. The recessed insulating material 126 may be the shallow trench isolation (STI).

Figure 6C:
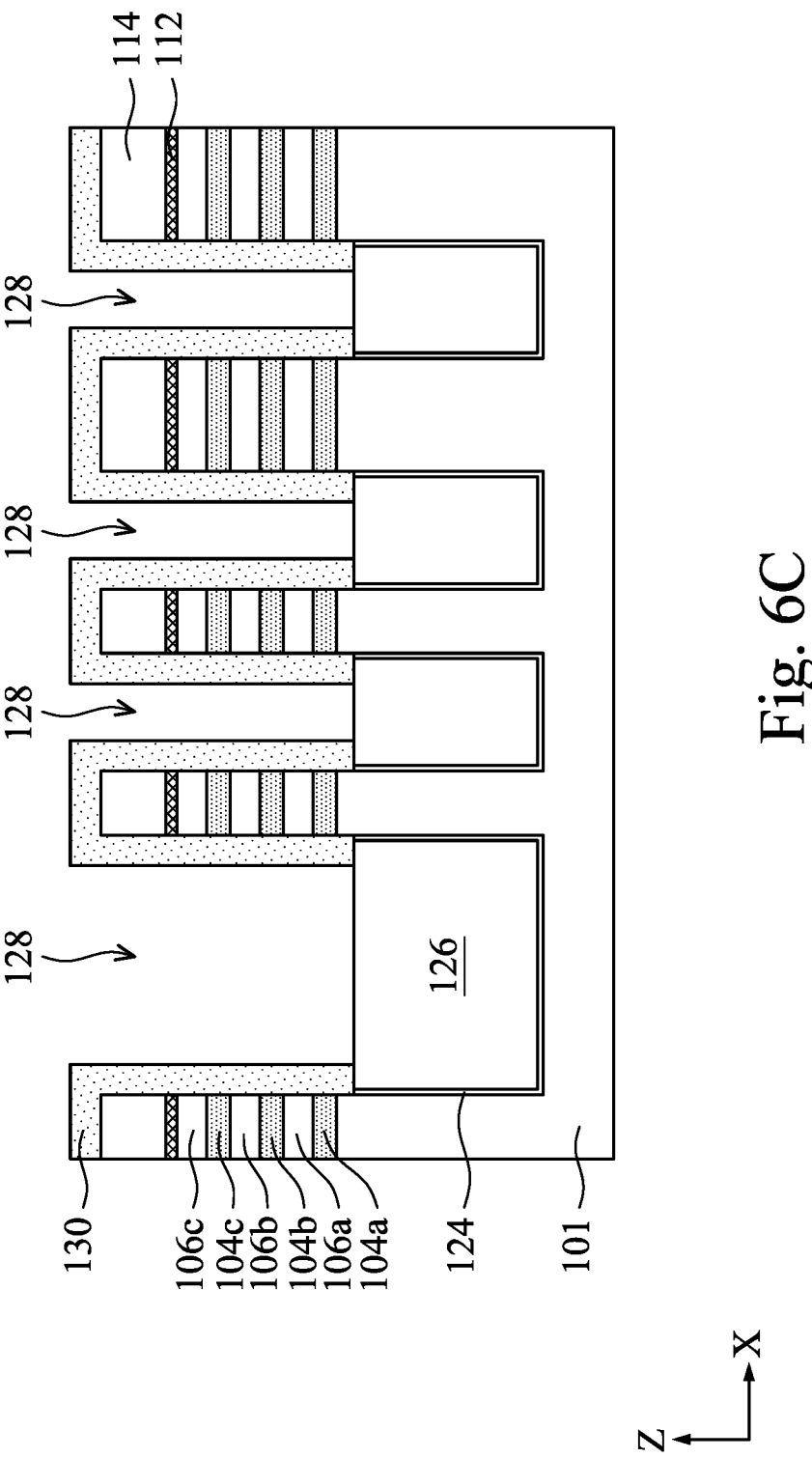

As shown in FIG. 6C, a cladding layer 130 is formed on the exposed surface of the liner 124. The liner 124 may be diffused into the cladding layer 130 during the formation of the cladding layer 130. Thus, in some embodiments, the cladding layer 130 is in contact with the first and second semiconductor layers 104*a-c*, 106*a-c*, as shown in FIG. 6C. In some embodiments, the cladding layer 130 includes a semiconductor material. The cladding layer 130 grows on semiconductor materials but not on dielectric materials. For example, the cladding layer 130 includes SiGe and is grown on the semiconductor material of the liner 124 but not on the dielectric material of the insulating material 126. In some embodiments, the cladding layer 130 and the first semiconductor layers 104*a-c* include the same material having the same etch selectivity. For example, the cladding layer 130 and the first semiconductor layers 104*a-c* include SiGe. The cladding layer 130 and the first semiconductor layer 104*a-c* are removed subsequently to create space for the gate electrode layer. In some embodiments, dummy oxide layers may be formed before and after the formation of the cladding layer 130. For example, the cladding layer 130 may be disposed between two dummy oxide layers.

Figure 6D:
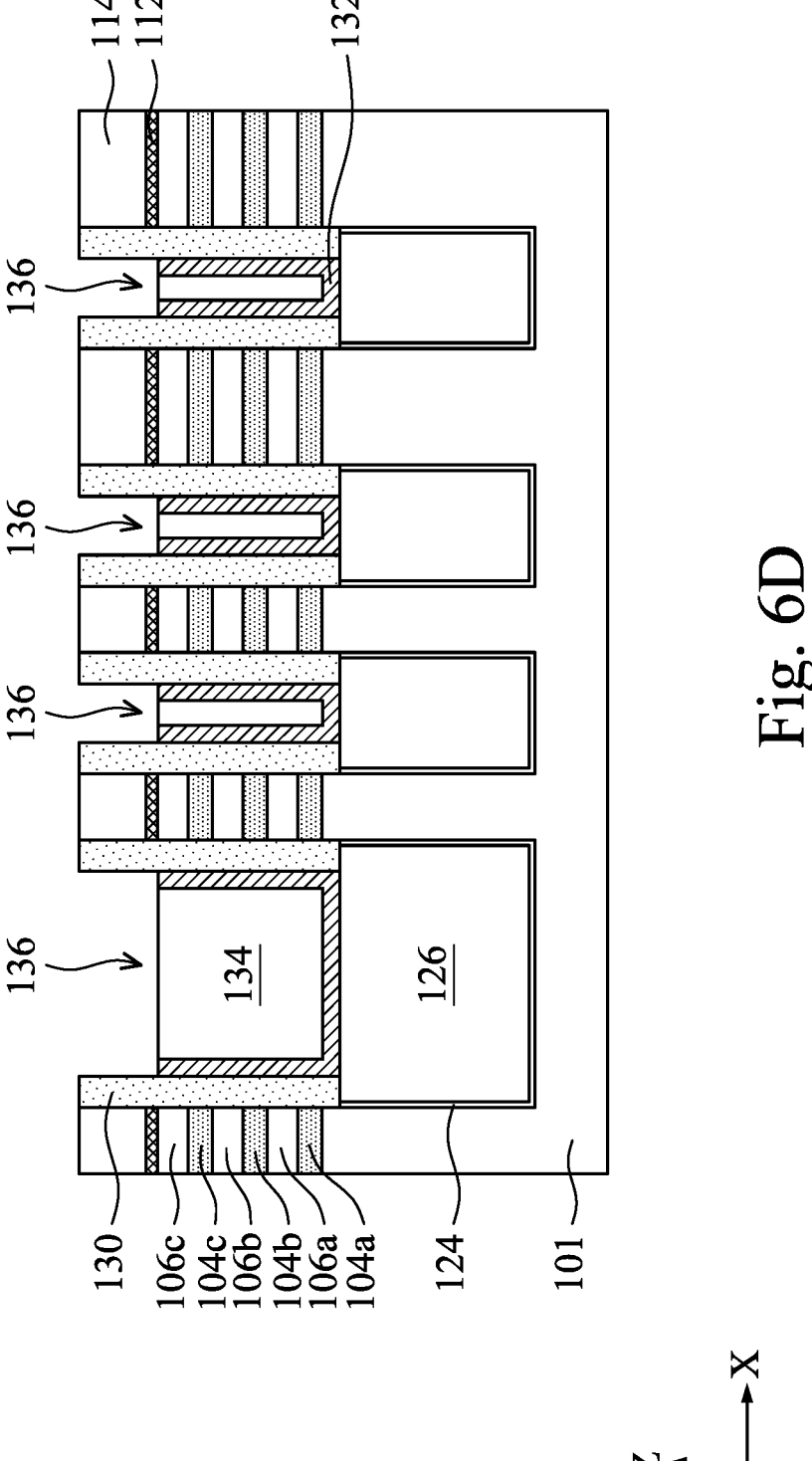

As shown in FIG. 6D, a liner 132 and a dielectric material 134 are formed in the trenches 128 (FIG. 6C). The liner 132 may include dielectric material having a K value lower than 7, such as SiCN, SiOC, or SiOCN. The liner 132 may be intrinsic or doped with a p-type dopant or an n-type dopant. The liner 132 may be formed by a conformal process, such as an ALD process. The dielectric material 134 may include the same material as the insulating material 126 and may be formed by a flowable process, such as an FCVD process. The liner 132 and the dielectric material 134 may be initially formed over the cladding layer 130 and then recessed, as shown in FIG. 6D. Prior to the recess of the liner 132 and the dielectric material 134, a planarization process may be performed to remove the portions of the liner 132 and the dielectric material 134 disposed over the cladding layer 130. In some embodiments, portions of the cladding layer 130 may be also removed by the planarization process to expose the nitride layer 114, as shown in FIG. 6D. The planarization process may be any suitable process, such as a CMP process. The recess of the liner 132 and the dielectric material 134 may be performed by any suitable process, such as dry etch, wet, etch, or a combination thereof. The recess of the liner 132 and the dielectric material 134 may be a selective process, and the semiconductor material of the cladding layer 130 and the nitride layer 114 are not substantially affected. The recess process may be controlled so that the liner 132 and the dielectric materials 134 are substantially at the same level as or below a top surface of the second semiconductor layer 106*c*. As a result of the recess process, trenches 136 are formed between adjacent fins 120.

Figure 6E:
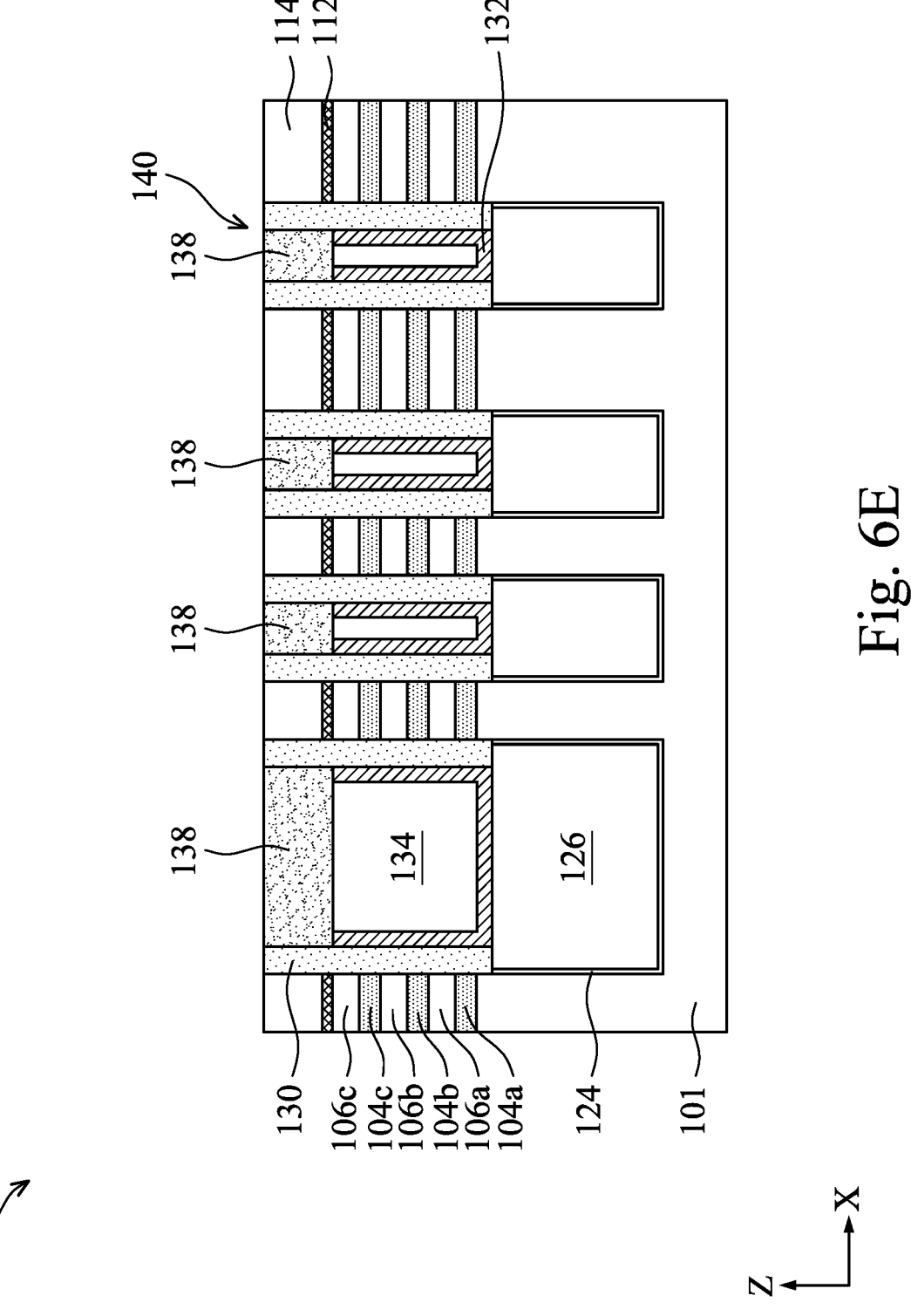

As shown in FIG. 6E, a high-K dielectric layer 138 is formed in each trench 136 (FIG. 6D). The high-K dielectric layer 138 may include a material having a K value greater than that of silicon oxide, such as HfO$_2$, ZrO$_2$, HfAlO$_x$, HfSiO$_x$, or Al$_2$O$_3$. In some embodiments, the high-K dielectric layer 138 includes a material having a K value greater than 7. In some embodiments, the high-K dielectric layer 138 includes a dielectric material having a K value greater than that of silicon dioxide. For example, the high-K dielectric layer 138 may include thermal oxide or chemical oxide, silicon oxynitride, hafnium based dielectric material, zirconium based dielectric material, aluminum based dielectric material, titanium based dielectric material, barium based dielectric material, nitride, or other suitable dielectric material. The high-K dielectric layer 138 may be formed by any suitable process, such as a CVD, PECVD, FCVD, or ALD process. The high-K dielectric layer 138 may be utilized to separate, or cut-off, the subsequently formed gate electrode layers.

The high-K dielectric layer 138 may be initially formed in the trenches 136 (FIG. 6D) and over the nitride layer 114 and the cladding layer 130. Portions of the high-K dielectric layer 138 formed over the nitride layer 114 and the cladding layer 130 may be removed by a planarization process, as shown in FIG. 6E. As shown in FIG. 6E, the high-K dielectric layer 138, the dielectric material 134, and the liner 132 together may be referred to as a dielectric feature 140. The dielectric features 140 can separate the S/D epitaxial features 156 (FIG. 7D) and the gate electrode layers 172 (FIG. 8). In some embodiments, the dielectric feature 140 is a hybrid fin. In some embodiments, the dielectric feature 140 is a single dielectric material. In some embodiments, the dielectric feature 140 includes two or more dielectric materials. After the formation of the high-K dielectric layer 138, the nitride layer 114 and the oxide layer 112 are removed. The nitride layer 114 and the oxide layer 112 may be removed by any suitable process, such as one or more selective etch processes that do not substantially affect the high-K dielectric layer 138.

Figure 6F:
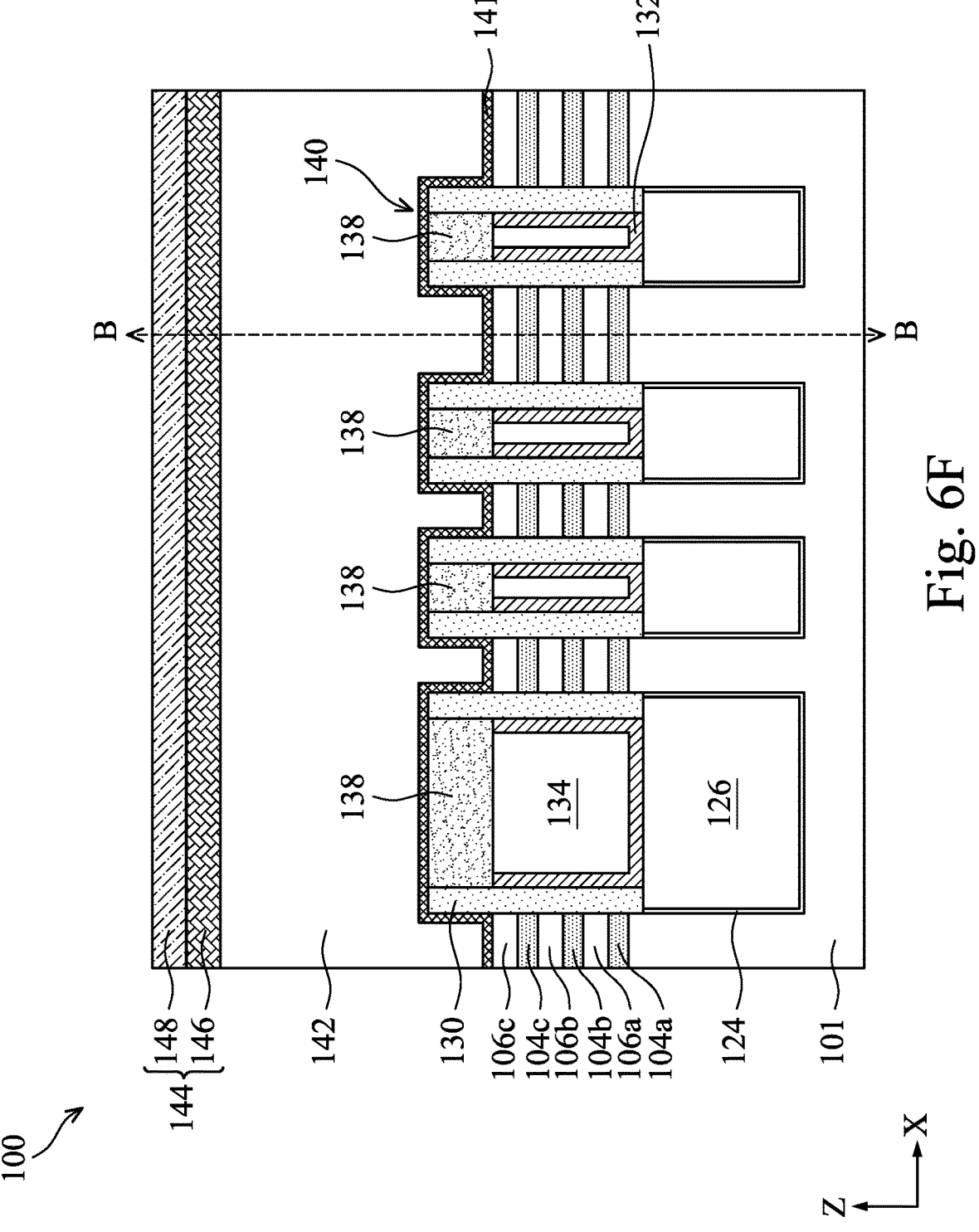

As shown in FIG. 6F, a sacrificial gate dielectric layer 141, a sacrificial gate electrode layer 142, and a mask structure 144 are formed on the semiconductor device structure 100. The sacrificial gate dielectric layer 141 may include any suitable dielectric material, such as silicon oxide. The sacrificial gate electrode layer 142 may include polycrystalline silicon (polysilicon). The mask structure 144 may include an oxygen-containing layer 146 and a nitrogen-containing layer 148. In some embodiments, the sacrificial gate dielectric layer 141, the sacrificial gate electrode layer 142, and the mask structure 144 are formed by various processes such as layer deposition, for example, CVD (including both LPCVD and PECVD), PVD, ALD, thermal oxidation, e-beam evaporation, or other suitable deposition techniques, or combinations thereof.

Figure 7B:
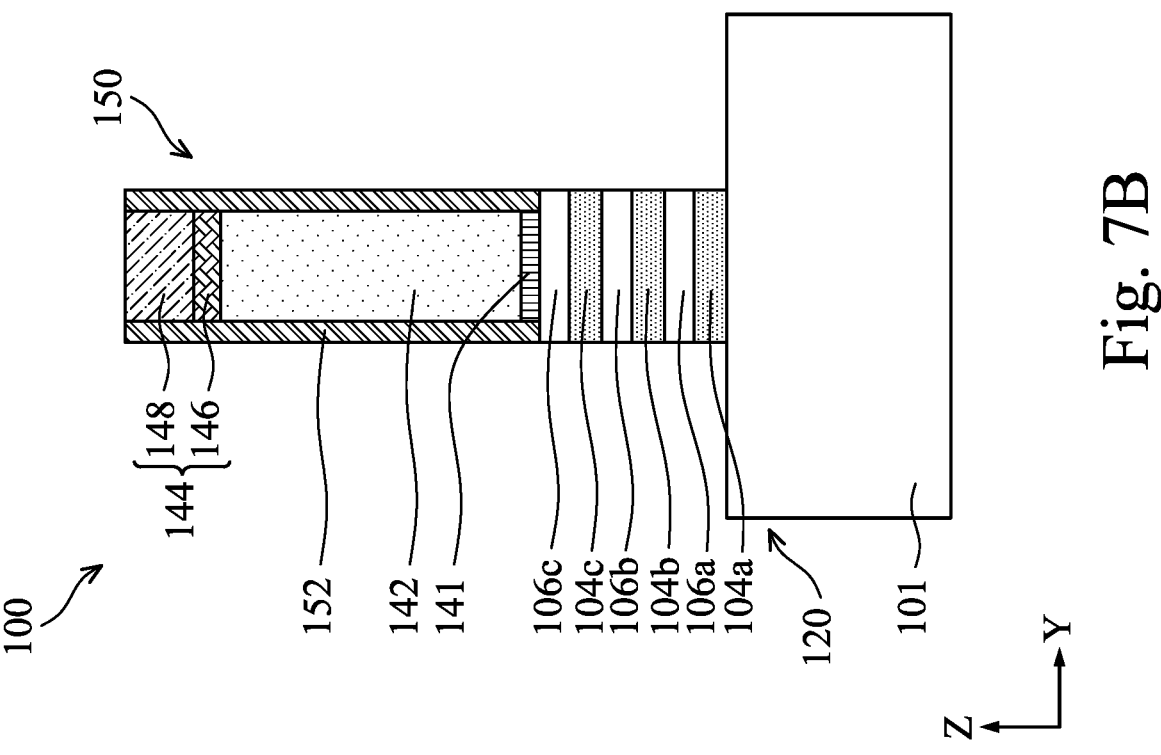
FIGS. 7A-7F are cross-sectional side views of various stages of manufacturing the semiconductor device structure taken along line B-B of FIG. 6F, in accordance with some embodiments.
Figure 7A:
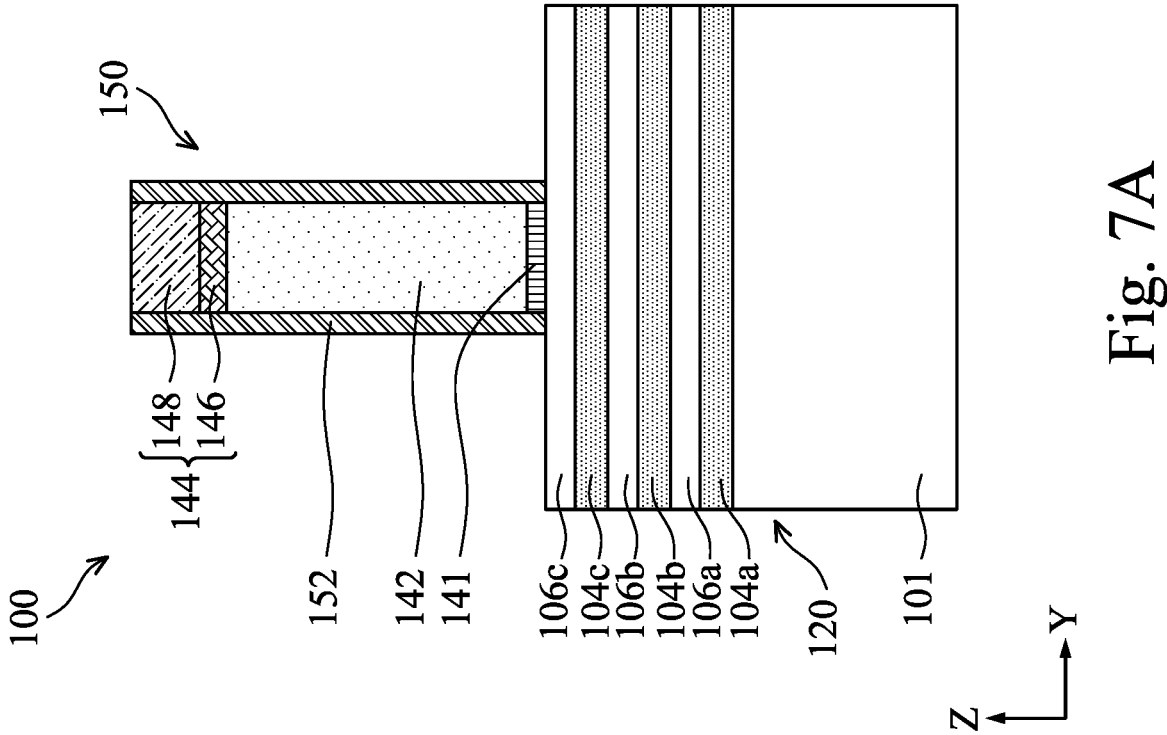

FIGS. 7A-7F are cross-sectional side views of various stages of manufacturing the semiconductor device structure 100 taken along line B-B of FIG. 6F, in accordance with some embodiments. As shown in FIG. 7A, portions of the sacrificial gate dielectric layer 141, the sacrificial gate electrode layer 142, and the mask structure 144 are removed to form a sacrificial gate stack 150, and spacers 152 are formed on sidewalls of the sacrificial gate stack 150. The sacrificial gate stack 150 may be formed by patterning and etching processes. For example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, other etching methods, and/or combinations thereof.

The spacers 152 may be formed by any suitable process, such as ALD. For example, the spacer 152 may be conformally on the exposed surfaces of the semiconductor device structure 100, followed by an anisotropic etch process to remove portions of the spacers 152 formed on horizontal surfaces. The spacer 152 may be made of a dielectric material such as silicon oxide, silicon nitride, silicon carbide, silicon oxynitride, SiCN, silicon oxycarbide, SiOCN, and/or combinations thereof. In some embodiments, the spacer 152 includes multiple layers, such as main spacer walls, liner layers, and the like.

As shown in FIG. 7B, an etch process may be performed to remove the portions of the first and second semiconductor layers 104*a-c*, 106*a-c* on opposite sides of the sacrificial gate stack 150. The etch process may be a selective etch process that removes the semiconductor materials of the first and the second semiconductor layers 104*a-c*, 106*a-c* but not the spacers 152 and the high-K dielectric layer 138. The etch process may be any suitable etch process, such as dry etch, wet etch, or a combination thereof.

At this stage, end portions of the first and second semiconductor layers 104*a-c*, 106*a-c* under the sacrificial gate stack 150 have substantially flat surfaces which may be flush with the spacers 152, as shown in FIG. 7B.

Figure 7D:
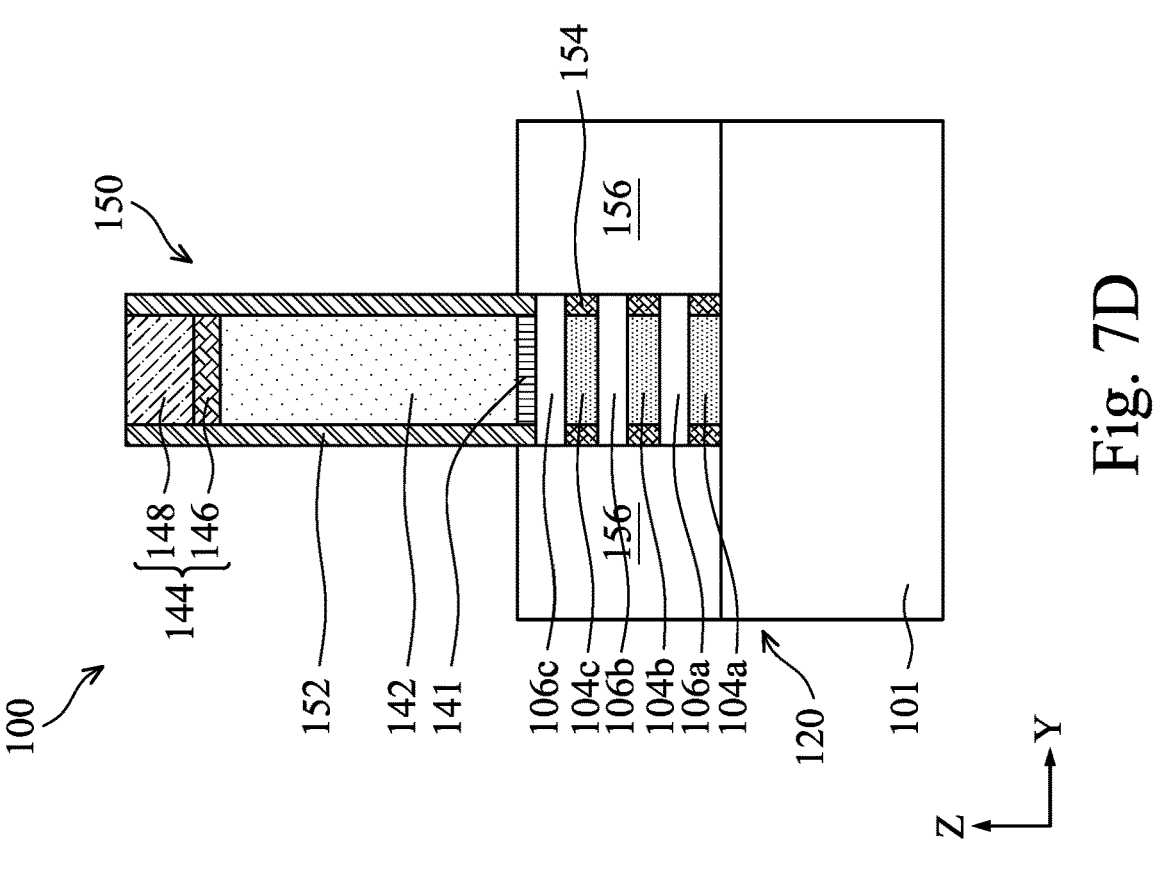
Figure 7C:
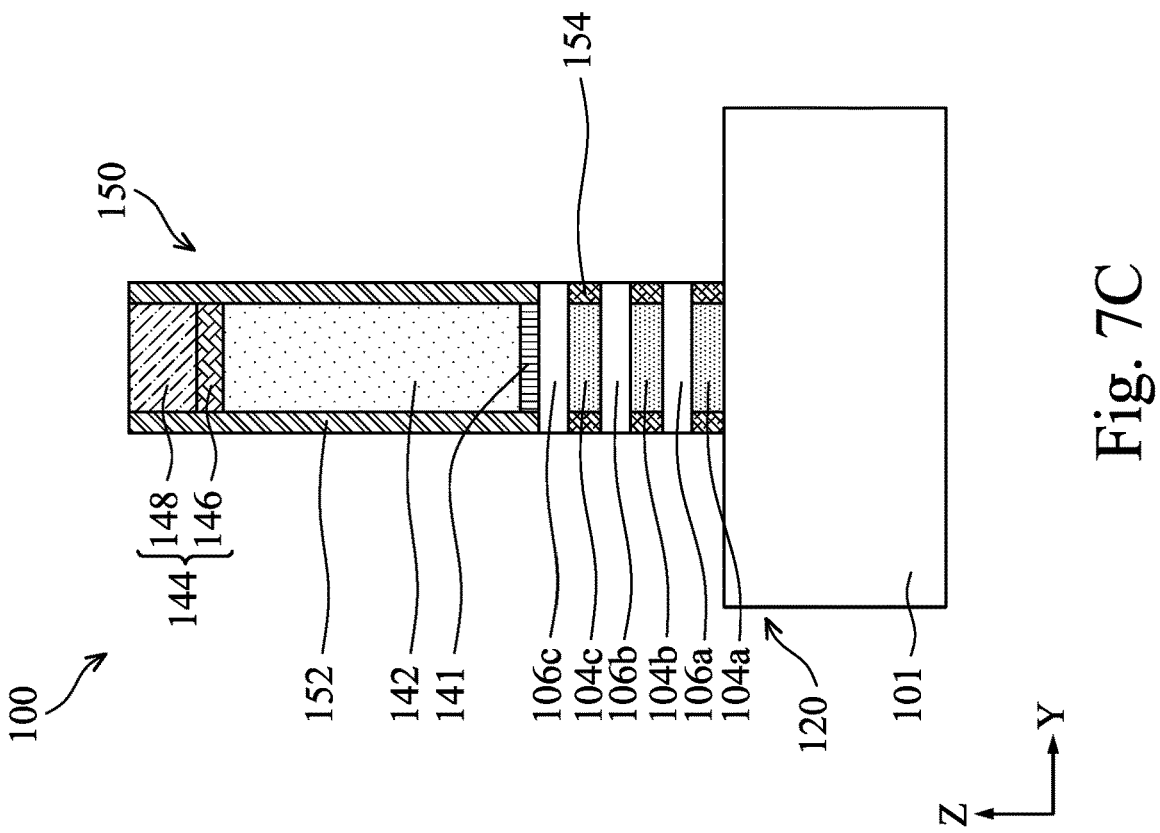

As shown in FIG. 7C, the edge portions of each first semiconductor layer 104*a-c* (including the interface regions 102*a-f*) are removed, and inner spacers 154 are formed in the space created by the removal of the edge portions of the first semiconductor layers 104*a-c*. In some embodiments, the portions of the first semiconductor layers 104*a-c* are removed by a selective wet etching process that does not substantially affect the second semiconductor layers 106*a-c*. For example, in cases where the first semiconductor layers 104*a-c* are made of SiGe, and the second semiconductor layers 106*a-c* are made of silicon, a selective wet etching including an ammonia and hydrogen peroxide mixtures (APM) may be used. The wet etch process does not substantially affect the dielectric materials of the spacers 152, the high-K dielectric layer 138, and the nitrogen-containing layer 148. The inner spacers 154 may be made of a dielectric material, such as SiON, SiCN, SiOC, SiOCN, or SiN. In some embodiments, the inner spacers 154 may be formed by first forming a conformal dielectric layer using a conformal deposition process, such as ALD, followed by an anisotropic etching to remove portions of the conformal dielectric layer other than the inner spacers 154. The inner spacers 154 may be protected by the second semiconductor layers 106*a-c* during the anisotropic etching process. The inner spacers 154 may include a material different from the material of the spacers 152, so the spacers 152 are not substantially affected during the anisotropic etching process. In some embodiments, the inner spacers 154 include the same material as the spacers 152.

As shown in FIG. 7D, S/D epitaxial features 156 are formed on opposite sides of the first and second semiconductor layers 104*a-c*, 106*a-c*. The S/D epitaxial feature 156 may include one or more layers of Si, SiP, SiC and SiCP for an n-channel FET or Si, SiGe, Ge for a p-channel FET. The S/D epitaxial features 156 may grow both vertically and horizontally to form facets, which may correspond to crystalline planes of the material used for the substrate 101. The S/D epitaxial features 156 are formed by an epitaxial growth method using CVD, ALD or MBE. The S/D epitaxial features 156 are in contact with the second semiconductor layers 106*a-c* and the inner spacers 154, as shown in FIG. 7D. The S/D epitaxial features 156 may be the S/D regions. In this disclosure, a source and a drain are interchangeably used, and the structures thereof are substantially the same. Furthermore, source/drain region(s) may refer to a source or a drain, individually or collectively dependent upon the context.

An annealing process may be performed for dopant activation in the S/D epitaxial features 156. In some embodiments, the annealing process may be performed at a temperature ranging from about 750 degrees Celsius to about 950 degrees Celsius. In some embodiments, the annealing process is a flash anneal at a temperature ranging from about 1000 degrees Celsius to about 1050 degrees Celsius. Due to the high temperature during the annealing process, the thicknesses of the interface regions 102*a-f* (FIG. 1F) are increased. In some embodiments, the thickness of each of the interface region 102*a-f* is increased by about 1 nm to about 2.5 nm, and the differences between the thicknesses of the interface regions 102*a-f* remain the same. For example, the thickness T3 shown in FIG. 1F is increased by 1 nm to about 2.5 nm after the annealing process.

Figure 7F:
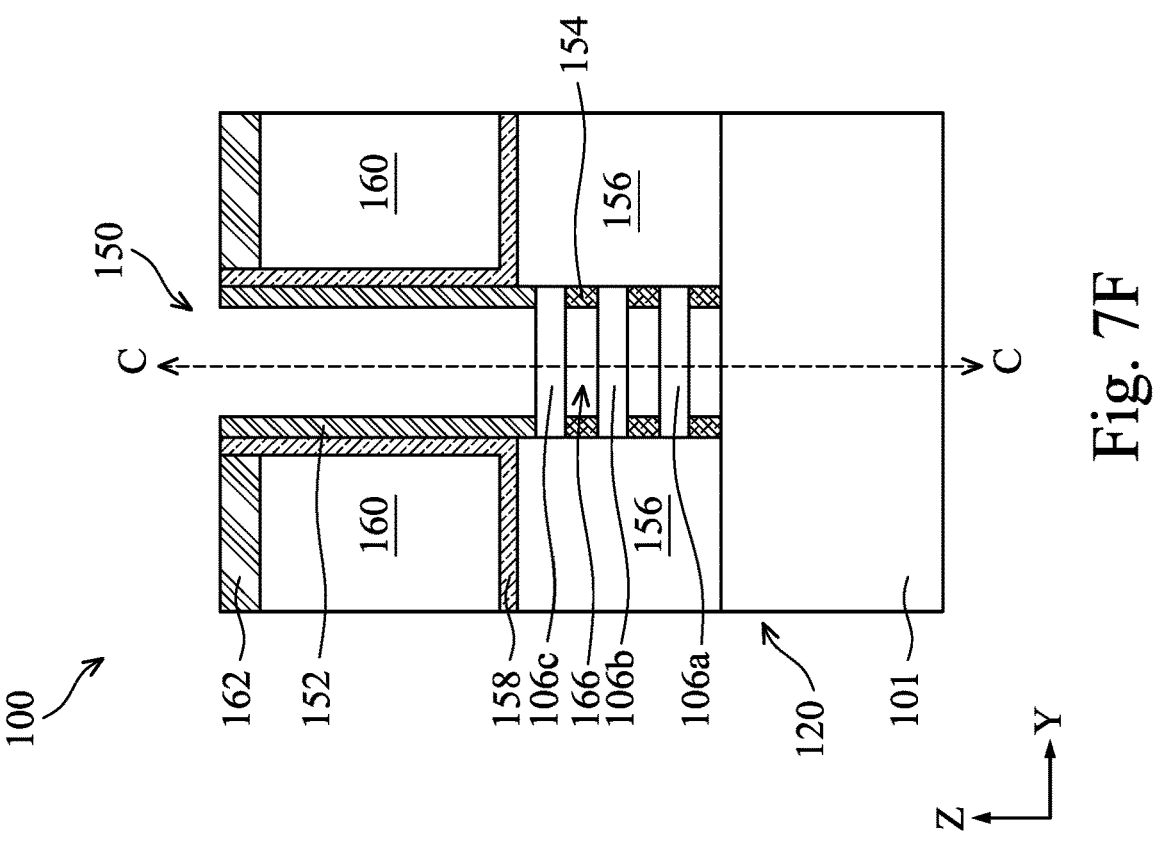
Figure 7E:
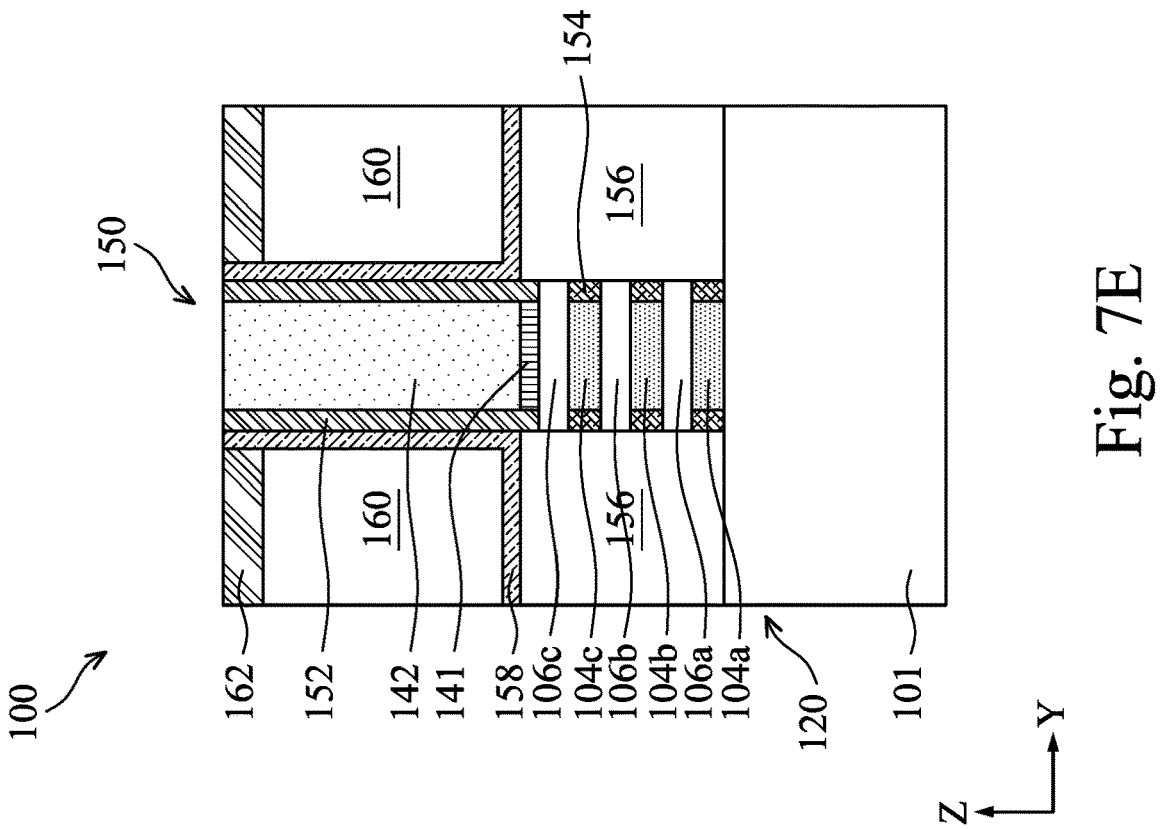

As shown in FIG. 7E, a contact etch stop layer (CESL) 158 may be formed on the S/D epitaxial features 156, the dielectric features 140, and the sacrificial gate stacks 150. The CESL 158 may include an oxygen-containing material or a nitrogen-containing material, such as silicon nitride, silicon carbon nitride, silicon oxynitride, carbon nitride, silicon oxide, silicon carbon oxide, or the like, or a combination thereof. The CESL 158 may be formed by CVD, PECVD, ALD, or any suitable deposition technique. In some embodiments, the CESL 158 is a conformal layer formed by the ALD process. An interlayer dielectric (ILD) layer 160 may be formed on the CESL 2102. The materials for the ILD layer 160 may include oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 160 may be deposited by a PECVD process or other suitable deposition technique. In some embodiments, after formation of the ILD layer 160, the semiconductor device structure 100 may be subject to a thermal process to anneal the ILD layer 160.

A planarization process is performed to expose the sacrificial gate electrode layer 142, as shown in FIG. 7E. The planarization process may be any suitable process, such as a CMP process. The planarization process removes portions of the ILD layer 160 and the CESL 158 disposed on the sacrificial gate stacks 150. The planarization process may also remove the mask structure 144 (FIG. 7D). The ILD layer 160 may be recessed to a level below the top of the sacrificial gate electrode layer 142, and a nitrogen-containing layer 162, such as a SiCN layer, may be formed on the recessed ILD layer 160, as shown in FIG. 7E. The nitrogen-containing layer 162 may protect the ILD layer 160 during subsequent etch processes.

As shown in FIG. 7F, the sacrificial gate electrode layer 142 and the sacrificial gate dielectric layer 141 are removed. The sacrificial gate electrode layers 142 and the sacrificial gate dielectric layer 141 may be removed by any suitable process, such as dry etch, wet etch, or a combination thereof. In some embodiments, a wet etchant such as a tetramethylammonium hydroxide (TMAH) solution can be used to selectively remove the sacrificial gate electrode layer 142 but not the nitrogen-containing layer 162 and the CESL 158. The sacrificial gate dielectric layer 141 may be removed by the wet etch process or by a separate etch process. Next, the cladding layers 130 and the first semiconductor layers 104*a-c* (including the interface regions 102*a-f*) are removed. The removal process exposes the inner spacers 154 and the second semiconductor layers 106*a-c*, as shown in FIG. 7F. The removal process may be referred to as a channel release process. The removal process may be any suitable processes, such as dry etch, wet etch, or a combination thereof. In some embodiments, an etch process may be performed to remove the cladding layers 130 and the first semiconductor layers 104a-c. The etch process may be a selective etch process that does not substantially affect the second semiconductor layers 106a-c, the high-K dielectric layer 138, the liner 132, and the nitrogen-containing layer 162. As described above, the thickness of the interface regions 102a-f are controlled to be small, so the thickness of the second semiconductor layers 106a-c is not reduced. Openings 166 are formed in the channel regions of the semiconductor device structure 100, as shown in FIG. 7F. The second semiconductor layers 106a-c and the dielectric features 140 may be exposed in the openings 166. Each second semiconductor layer 106a-c may be a nanostructure channel of the nanosheet transistor.

As shown in FIG. 7F, each second semiconductor layer 106a-c has a thickness in the Z axis ranging from about 3 nm to about 6 nm. The thickness may be smaller than the thickness of the second semiconductor layer 106a-c prior to the removal of the cladding layer 130 and the first semiconductor layer 104a-c, because a portion of the second semiconductor layer 106a-c is also removed during the removal of the cladding layer 130 and the first semiconductor layer 104a-c. The thickness of the second semiconductor layer 106a-c prior to the removal of the cladding layer 130 and the first semiconductor layer 104a-c is substantially smaller than the thickness of the as deposited second semiconductor layer 106a-c, because the annealing process performed after the formation of the S/D epitaxial features 156 increased the thickness of the interface regions 102a-f. The distance between vertically adjacent second semiconductor layers 106a-c may range from about 8 nm to about 12 nm. The distance may be substantially greater than the thickness T3 shown in FIG. 1F after the annealing process described in FIG. 7D, due to the removal of portions of the second semiconductor layers 106a-c during the removal of the cladding layer 130 and the first semiconductor layers 104a-c. In some embodiments, the ratio of the distance between vertically adjacent second semiconductor layers 106a-c to the thickness of the second semiconductor layer 106a-c ranges from about 2 to about 3.

FIG. 8 is a cross-sectional side view of one of various stages of manufacturing the semiconductor device structure 100 taken along line C-C of FIG. 7F, in accordance with some embodiments. As shown in FIG. 8, after the formation of the openings 166, an oxygen-containing layer 168 may be formed around the exposed surfaces of the second semiconductor layers 106a-c and the substrate 101 in the openings 166, followed by forming a gate dielectric layer 170 on the oxygen-containing layer 168 and the dielectric features 140. The oxygen-containing layer 168 may be an oxide layer, and the gate dielectric layer 170 may include the same material as the high-K dielectric layer 138. The oxygen-containing layer 168 and the gate dielectric layer 170 may be formed by any suitable processes, such as ALD processes. In some embodiments, the oxygen-containing layer 168 and the gate dielectric layer 170 are formed by conformal processes.

The gate electrode layer 172 is formed in the openings 166 (FIG. 7F) and on the gate dielectric layer 170. The gate electrode layer 172 is formed on the gate dielectric layer 170 to surround a portion of each second semiconductor layer 106a-c. The gate electrode layer 172 includes one or more layers of electrically conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, metal-containing silicides (NiSi), metal-containing carbides (TaC), other suitable materials, and/or combinations thereof. The gate electrode layer 172 may be formed by PVD, CVD, ALD, electro-plating, or other suitable method.

The gate electrode layer 172 may be also deposited over the nitrogen-containing layer 162 (FIG. 7F). The gate electrode layer 172 formed over the nitrogen-containing layer 162 may be removed by using, for example, CMP, until the nitrogen-containing layer 162 is exposed.

The gate electrode layer 172 may be recessed to a level below a top surface of the high-K dielectric layer 138 of the dielectric feature 140, as shown in FIG. 8. Thus, the high-K dielectric layer 138 may be between two gate electrodes layers 172. The recess process may be any suitable process, such as a dry etch, a wet etch, or a combination thereof. In some embodiments, the recess process may be a selective dry etch process that does not substantially affect the nitrogen-containing layer 162, the spacers 152, and the gate dielectric layer 170.

A dielectric material 174 is formed over the gate electrode layer 172 and the high-K dielectric layer 138, as shown in FIG. 19. The dielectric material 174 may include SiO, HfSi, SiOC, AlO, ZrSi, AlON, ZrO, HfO, TiO, ZrAlO, ZnO, TaO, LaO, YO, TaCN, SiN, SiOCN, ZrN, or SiCN. The dielectric material 174 may be formed by any suitable process, such as PECVD.

As shown in FIG. 8, the bottom portion of the fin 120 has a width W1, which may be the width of the second semiconductor layer 106a-c before the removal of the cladding layer 130 and the first semiconductor layers 104a-c. The width W1 may be defined by the formation of the fins 120 described in FIG. 6A. In some embodiments, the width W1 ranges from about 25 nm to about 35 nm. The width W2 is the width (or thickness) of the cladding layer 130. The width W2 may range from about 6 nm to about 12 nm. The width W3 of the second semiconductor layers 106a-c after the removal of the first semiconductor layers 104a-c and the cladding layer 130 may be substantially smaller than the width W1, because the removal process may also remove a portion of each of second semiconductor layers 106a-c. In some embodiments, the width W3 ranges from about 15 nm to about 25 nm. The removal of the cladding layer 130 and the first semiconductor layers 104a-c may also remove a portion of the liner 132, so a distance D between the liner 132 and the second semiconductor layer 106 is substantially greater than the width W2. In some embodiments, the distance D ranges from about 10 nm to about 15 nm. In some embodiments, the ratio of the width W3 to the distance D ranges from about 1.5 to about 3.

The present disclosure provides a method for forming a semiconductor device structure 100. The method includes performing purge processes between deposition processes of first and second semiconductor layers 104a-c, 106a-c. The purge processes include a chlorine-containing gas that can remove germanium ions formed on the surfaces of the first semiconductor layers 104a-c or to make the surfaces of the second semiconductor layers 106a-c smoother for subsequent deposition process. Some embodiments may achieve advantages. For example, by removing germanium ions formed on the surfaces of the first semiconductor layers 104a-c, the thicknesses of the interface regions 102b, 102d, 102f can be controlled to be small. Thin interface regions 102b, 102d, 102f can lead to increased thickness of each channel region (i.e., the second semiconductor layers 106a-c), which in turn leads to improved device performance.

An embodiment is a method. The method includes forming a first semiconductor layer over a substrate in a processing chamber and performing a purge process. The purge process includes flowing a chlorine-containing gas into the processing chamber. The method further includes forming a second semiconductor layer over the first semiconductor layer, and an interface region is formed between the first and second semiconductor layers.

Another embodiment is a method. The method includes forming a first semiconductor layer over a substrate in a processing chamber and performing a first purge process. The first purge process includes flowing a first chlorine-containing gas into the processing chamber, and the first purge process is performed for a first time duration. The method further includes forming a second semiconductor layer different from the first semiconductor layer over the first semiconductor layer, and a first interface region is formed between the first and second semiconductor layers. The method further includes performing a second purge process for a second time duration substantially less than the first time duration, and forming a third semiconductor layer different from the second semiconductor layer over the second semiconductor layer. A second interface region is formed between the second and third semiconductor layers.

A further embodiment is a method. The method includes forming a plurality of semiconductor layers over a substrate, and a purge process is performed after the formation of each of the plurality of semiconductor layers. The purge process includes flowing a chlorine-containing gas into a processing chamber. The method further includes removing portions of the plurality of semiconductor layers to form a fin, forming a sacrificial gate stack over a portion of the fin, removing exposed portions of the fin to expose portions of the substrate, forming source/drain epitaxial features on the exposed portions of the substrate, removing the sacrificial gate stack, and forming a gate electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
   forming a first semiconductor layer over a substrate in a processing chamber;
   performing a purge process, comprising flowing a chlorine-containing gas into the processing chamber to remove germanium ions from a surface of the first semiconductor layer; and
   forming a second semiconductor layer over the surface of the first semiconductor layer, wherein an interface region is formed between the first and second semiconductor layers.

2. The method of claim 1, wherein the forming the first semiconductor layer comprises flowing one or more silicon-containing precursors and one or more germanium-containing precursors into the processing chamber.

3. The method of claim 2, wherein the one or more silicon-containing precursors comprise dichlorosilane and silane.

4. The method of claim 2, wherein the purge process further comprises flowing the one or more silicon-containing precursors into the processing chamber.

5. The method of claim 4, wherein the chlorine-containing gas is silicon free.

6. The method of claim 4, wherein the chlorine-containing gas comprises HCl or $Cl_2$.

7. The method of claim 1, wherein a pressure inside the processing chamber during the forming the first semiconductor layer is substantially less than a pressure inside processing chamber during the purge process.

8. A method, comprising:
   forming a first semiconductor layer over a substrate in a processing chamber;
   performing a first purge process, comprising flowing a first chlorine-containing gas into the processing chamber to remove germanium ions from a surface of the first semiconductor layer, wherein the first purge process is performed for a first time duration;
   forming a second semiconductor layer different from the first semiconductor layer over the surface of the first semiconductor layer, wherein a first interface region is formed between the first and second semiconductor layers;
   performing a second purge process for a second time duration substantially less than the first time duration; and
   forming a third semiconductor layer different from the second semiconductor layer over the second semiconductor layer, wherein a second interface region is formed between the second and third semiconductor layers.

9. The method of claim 8, wherein each of the first and third semiconductor layers comprises SiGe.

10. The method of claim 9, wherein the second semiconductor layer comprises silicon.

11. The method of claim 8, further comprising:
   performing a third purge process after forming the third semiconductor layer;
   forming a fourth semiconductor layer different from the third semiconductor layer over the third semiconductor layer, wherein a third interface region is formed between the third and fourth semiconductor layers;
   performing a fourth purge process;
   forming a fifth semiconductor layer different from the fourth semiconductor layer over the fourth semiconductor layer, wherein a fourth interface region is formed between the fourth and fifth semiconductor layers;
   performing a fifth purge process; and
   forming a sixth semiconductor layer different from the fifth semiconductor layer over the fifth semiconductor layer, wherein a fifth interface region is formed between the fifth and sixth semiconductor layers.

12. The method of claim 11, wherein the first interface region has a first thickness, the second interface region has a second thickness, the third interface region has a third thickness, the fourth interface region has a fourth thickness, and the fifth interface region has a fifth thickness.

13. The method of claim 12, wherein the fifth thickness is substantially greater than the third thickness, which is substantially greater than the first thickness.

14. The method of claim 13, wherein the fourth thickness is substantially greater than the second thickness.

15. The method of claim 14, further comprising a sixth interface region formed between the first semiconductor layer and the substrate, wherein the sixth interface region has a sixth thickness.

16. The method of claim 15, wherein the sixth thickness is substantially less than the second thickness.

17. A method, comprising:

forming a plurality of semiconductor layers over a substrate, wherein a purge process is performed after the formation of each of the plurality of semiconductor layers, and the purge process comprises flowing a chlorine-containing gas into a processing chamber;

removing portions of the plurality of semiconductor layers to form a fin;

forming a sacrificial gate stack over a portion of the fin;

removing exposed portions of the fin to expose portions of the substrate;

forming source/drain epitaxial features on the exposed portions of the substrate;

removing the sacrificial gate stack; and forming a gate electrode layer.

18. The method of claim 17, further comprising forming a dielectric feature prior to forming the sacrificial gate stack.

19. The method of claim 17, wherein the plurality of semiconductor layers comprises first semiconductor layers and second semiconductor layers.

20. The method of claim 19, further comprising removing the second semiconductor layers, wherein the gate electrode layer surrounds at least a portion of each of the first semiconductor layers.

* * * * *